United States Patent
Koike

(10) Patent No.: US 10,985,311 B2
(45) Date of Patent: Apr. 20, 2021

(54) SEMICONDUCTOR ELEMENT, MAGNETORESISTANCE EFFECT ELEMENT, MAGNETIC SENSOR AND SPIN TRANSISTOR

(71) Applicant: TDK CORPORATION, Tokyo (JP)

(72) Inventor: Hayato Koike, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/565,549

(22) Filed: Sep. 10, 2019

(65) Prior Publication Data
US 2020/0098979 A1  Mar. 26, 2020

(30) Foreign Application Priority Data

Sep. 20, 2018 (JP) .............................. JP2018-176242

(51) Int. Cl.
*H01L 43/10* (2006.01)
*H01L 43/02* (2006.01)
*G01R 33/09* (2006.01)
*H01L 29/66* (2006.01)
*H01L 43/08* (2006.01)

(52) U.S. Cl.
CPC ............ *H01L 43/10* (2013.01); *G01R 33/093* (2013.01); *H01L 29/66984* (2013.01); *H01L 43/02* (2013.01); *H01L 43/08* (2013.01)

(58) Field of Classification Search
None
See application file for complete search history.

(56) References Cited

U.S. PATENT DOCUMENTS

| | | | | |
|---|---|---|---|---|
| 2007/0275515 A1* | 11/2007 | Wu | ................... | H01L 29/66901 438/186 |
| 2008/0106926 A1* | 5/2008 | Brubaker | ................ | G11C 11/24 365/148 |
| 2010/0314702 A1 | 12/2010 | Sasaki et al. | | |
| 2016/0284982 A1 | 9/2016 | Sasaki et al. | | |

FOREIGN PATENT DOCUMENTS

JP       2010-287666 A    12/2010
WO       2015/076187 A1    5/2015

* cited by examiner

*Primary Examiner* — Anthony Ho
*Assistant Examiner* — Kevin Quinto
(74) *Attorney, Agent, or Firm* — Oliff PLC

(57) ABSTRACT

A semiconductor element includes a semiconductor layer, a first electrode and a second electrode. The first electrode and the second electrode are separated from each other on the semiconductor layer. The semiconductor layer has a first semiconductor region and a second semiconductor region. The first electrode and the second electrode are provided on the first semiconductor region. The second semiconductor region is separated from the first electrode and the second electrode. The second semiconductor region is provided to be in contact with at least a part of an end surface of the first semiconductor region. The first semiconductor region has n-type/p-type conductivity. The second semiconductor region has p-type/n-type conductivity.

14 Claims, 13 Drawing Sheets

SEMICONDUCTOR ELEMENT, MAGNETORESISTANCE EFFECT ELEMENT, MAGNETIC SENSOR AND SPIN TRANSISTOR

TECHNICAL FIELD

The present disclosure relates to a semiconductor element, a magnetoresistance effect element, a magnetic sensor and a spin transistor.

BACKGROUND

A magnetoresistance effect element having a ferromagnetic layer as a magnetization free layer, a nonmagnetic spacer layer, and a ferromagnetic layer as a magnetization fixed layer, such as a giant magnetoresistance (GMR) effect element and a tunnel magnetoresistance (TMR) effect element, are known. Such a magnetoresistance effect element is used in a device such as a magnetic sensor, a magnetic head, and a magnetoresistance random access memory (MRAM).

Magnetoresistance effect elements currently in practical use have a configuration in which a magnetization free layer, a nonmagnetic spacer layer, and a magnetization fixed layer are stacked in this order. However, in recent years, magnetoresistance effect elements having a configuration in which a magnetization free layer and a magnetization fixed layer are provided on an upper surface of a channel layer composed of a nonmagnetic material have received attention (for example, Patent Document 1 (Japanese Unexamined Patent Application Publication No. 2010-287666) and Patent Document 2 (WO 2015/076187)). In the magnetoresistance effect elements described in Patent Document 1 and Patent Document 2, the magnetization free layer and the magnetization fixed layer are formed on substantially the same plane, spin-polarized electrons injected from the magnetization free layer or the magnetization fixed layer into the channel layer transport or diffuse in the channel layer, and spins accumulate in the channel layer. According to the magnetoresistance effect element having such a configuration, it is expected that a high spatial resolution will be able to be obtained when it is applied to a magnetic sensor such as a magnetic head or the like on the basis of structural differences from a conventional magnetoresistance effect element, and it is also expected that a degree of freedom in a device design can be improved when it is applied to a device.

SUMMARY

In the magnetoresistance effect element as described above, one of the elements necessary for improving a signal-to-noise ratio (a SN ratio) is to increase a spin diffusion length and a spin lifetime when spin-polarized carriers (spin-polarized electrons or spin-polarized holes) transport or diffuse in the channel layer. From such a viewpoint, the magnetoresistance effect elements described in the above-mentioned Patent Documents 1 and 2 is formed as semiconductor elements. Specially, in the magnetoresistance effect elements described in the above-mentioned Patent Documents 1 and 2, the channel layer which is a transport path is generally constituted by a semiconductor material having a spin diffusion length and a spin lifetime longer than those of a metallic material.

However, even with such a configuration, the SN ratio of the semiconductor element as described above does not reach a level required for device application.

It is desirable to provide a semiconductor element, a magnetoresistance effect element, a magnetic sensor and a spin transistor capable of obtaining a larger SN ratio than a conventional one.

The inventors of the present invention have found that capturing or scattering of carriers by an interface trap present on a surface of a semiconductor layer which is a transport path is one of the reasons that the SN ratio is not sufficiently improved in the above-mentioned semiconductor element, as a result of intensive studies, and have thereby accomplished the present disclosure.

A semiconductor element according to one aspect of the present disclosure includes a semiconductor layer, a first electrode and a second electrode. The first electrode and the second electrode are separated from each other on the semiconductor layer. The semiconductor layer has a first semiconductor region and a second semiconductor region. The first electrode and the second electrode are provided on the first semiconductor region. The second semiconductor region is separated from the first electrode and the second electrode. The second semiconductor region is provided to be in contact with at least a part of an end surface of the first semiconductor region. The first semiconductor region has n-type conductivity. The second semiconductor region has p-type conductivity.

A semiconductor element according to one aspect of the present disclosure includes a semiconductor layer, a first electrode and a second electrode. The first electrode and the second electrode are separated from each other on the semiconductor layer. The semiconductor layer has a first semiconductor region and a second semiconductor region. The first electrode and the second electrode are provided on the first semiconductor region. The second semiconductor region is separated from the first electrode and the second electrode. The second semiconductor region is provided to be in contact with at least a part of an end surface of the first semiconductor region. The first semiconductor region has p-type conductivity. The second semiconductor region has n-type conductivity.

A magnetoresistance effect element according to one aspect of the present disclosure includes the semiconductor element, wherein each of the first electrode and the second electrode includes a ferromagnetic material.

A magnetic sensor according to one aspect of the present disclosure includes the magnetoresistance effect element.

A spin transistor according to one aspect of the present disclosure includes the magnetoresistance effect element.

DETAILED DESCRIPTION

Figure 1:
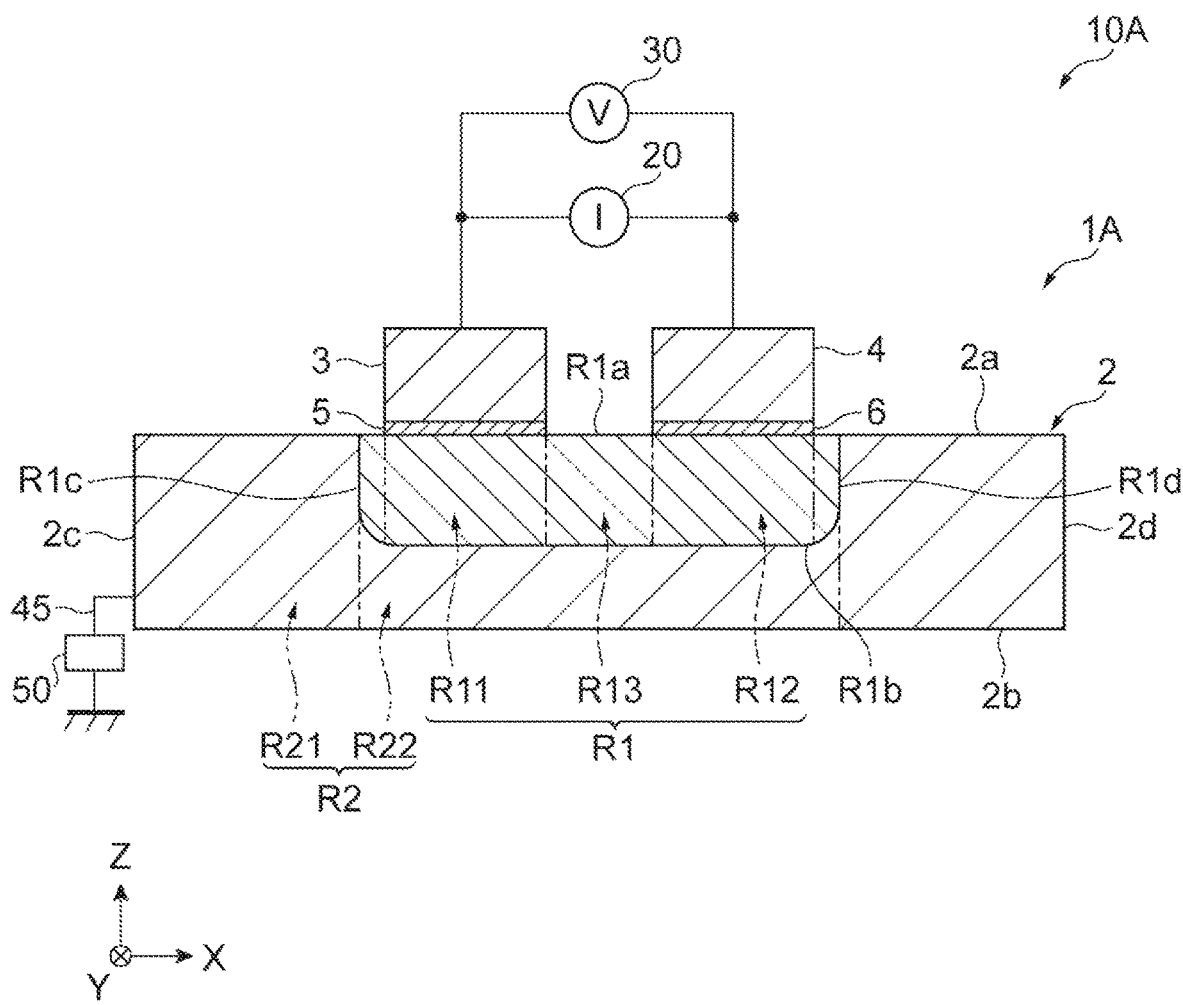
FIG. 1 is a cross-sectional view showing a magnetic sensor according to a first embodiment.

Hereinafter, embodiments of the present disclosure will be described in detail with reference to the accompanying drawings. In each of the drawings, the same reference numerals are used for the same elements when possible. Dimensional ratios in the constituent elements and between the constituent elements in the drawings are respectively arbitrary for ease of viewing of the drawings.

First Embodiment

Figure 2:
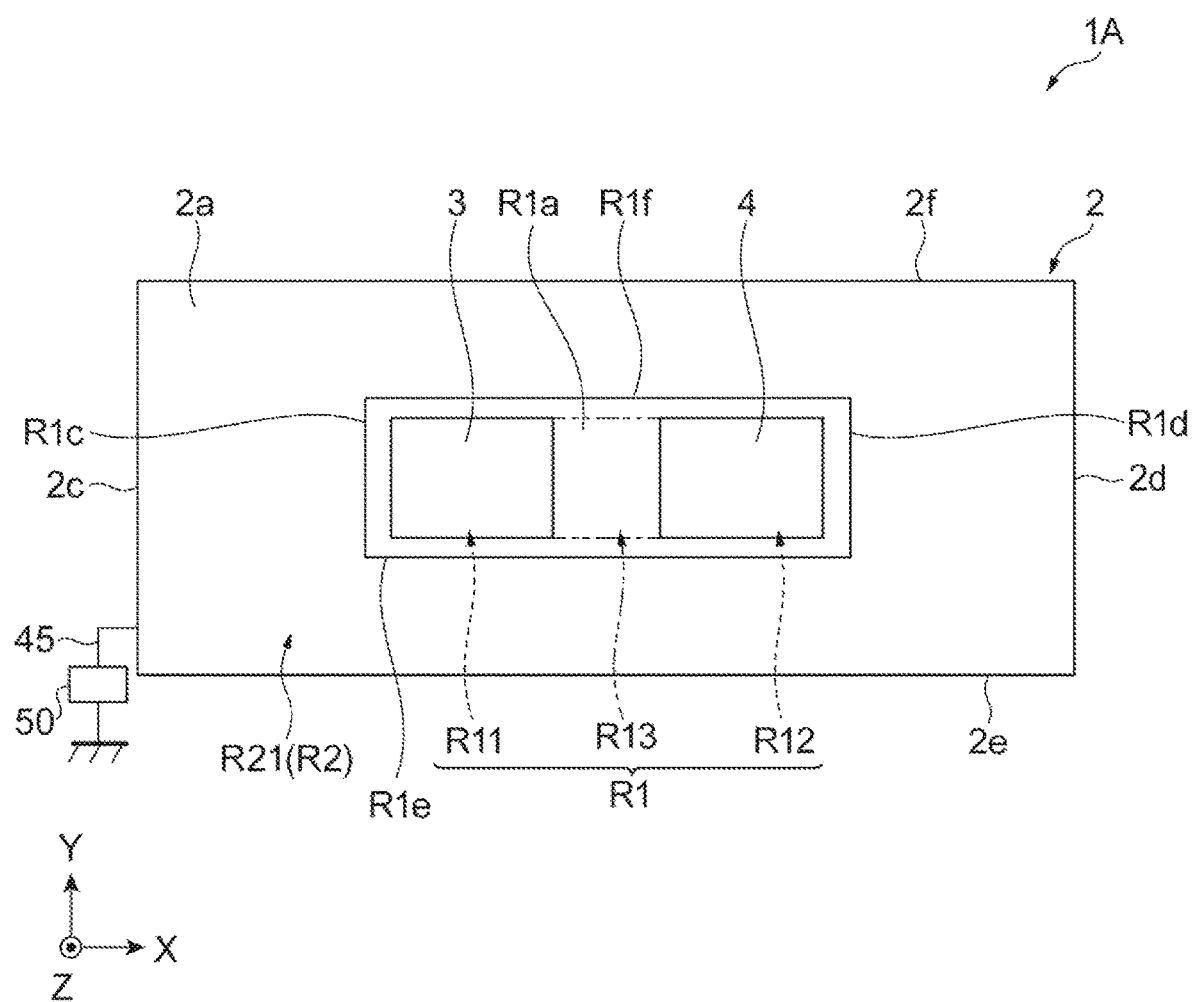
FIG. 2 is a top view of the magnetic sensor shown in FIG. 1.

With reference to FIGS. 1, 2, 3A, 3B, 4A and 4B, a magnetoresistance effect element 1A and a magnetic sensor 10A according to a first embodiment will be described. FIG. 1 is a cross-sectional view showing a magnetic sensor according to the first embodiment. FIG. 2 is a top view of the magnetic sensor shown in FIG. 1. FIGS. 3A, 3B, 4A and 4B are energy band diagrams in the vicinity of an interface between a first semiconductor region and a second semiconductor region. In FIGS. 1 to 2, an orthogonal coordinate system is shown.

As shown in FIGS. 1 and 2, the magnetic sensor 10A includes the magnetoresistance effect element 1A and is connected to a current source 20, a voltage measurement unit 30 and a voltage source 50. The magnetoresistance effect element 1A includes a semiconductor element which includes a semiconductor layer 2, a first ferromagnetic layer 3 (a first electrode), a second ferromagnetic layer 4 (a second electrode), a first insulating layer 5, a second insulating layer 6, and wiring 45. In the embodiment, the magnetoresistance effect element 1A is formed of the above-mentioned semiconductor element. In FIG. 2, the current source 20 and the voltage measurement unit 30 are not shown.

The semiconductor layer 2 has a rectangular parallelepiped shape. The semiconductor layer 2 includes an upper surface 2a and a lower surface 2b opposed to each other in a Z direction, side surfaces 2c and 2d opposed to each other in an X direction, and side surfaces 2e and 2f opposed to each other in a Y direction. In the embodiment, the upper surface 2a, the lower surface 2b, and the side surfaces 2c, 2d, 2e and 2f are substantially flat, but these surfaces may be curved. A detailed configuration of the semiconductor layer 2 will be described later. The upper surface 2a and the lower surface 2b may be disposed to be opposed to each other in a direction other than the direction of gravity, and any one of the side surfaces 2c, 2d, 2e and 2f may be substantially the upper surface and the lower surface.

The semiconductor layer 2 is composed of, for example, a semiconductor material, such as Si, Ge, C (diamond), GaAs or the like, as a base material. The semiconductor layer 2 has a first semiconductor region R1 and a second semiconductor region R2 having different conductivity types. That is, there are two cases for a combination of conductivity types of the first semiconductor region R1 and the second semiconductor region R2. A first case is a case in which the first semiconductor region R1 has n-type conductivity and the second semiconductor region R2 has p-type conductivity (hereinafter, referred to as a case A). A second case is a case in which the first semiconductor region R1 has p-type conductivity and the second semiconductor region R2 has n-type conductivity (hereinafter, referred to as a case B).

Impurities for imparting a conductivity type are added to the semiconductor material (the base material) of the first semiconductor region R1 and the second semiconductor region R2. In order for the first semiconductor region R1 and the second semiconductor region R2 to have n-type conductivity, an element having a valence electron number larger than that of the semiconductor material (the base material) is added as an impurity. In order for the first semiconductor region R1 and the second semiconductor region R2 to have p-type conductivity, an element having a valence electron number smaller than that of the semiconductor material (the base material) is added as an impurity. When the semiconductor material (the base material) included in the first semiconductor region R1 and the second semiconductor region R2 is Si, impurities (n-type dopants) for imparting n-type conductivity include P, As, Sb, and so on, and impurities (p-type dopants) for imparting p-type conductivity include B, Al, Ga, In and so on.

The first ferromagnetic layer 3 and the second ferromagnetic layer 4 are provided on the first semiconductor region R1. Carriers transport between the first ferromagnetic layer 3 and the second ferromagnetic layer 4 via the first semiconductor region R1. Here, the carriers (spin-polarized carriers) in which a direction of spins is aligned transport through the first semiconductor region R1. The first semiconductor region R1 has a rectangular parallelepiped shape. The first semiconductor region R1 includes an upper surface R1a and a lower surface R1b opposed to each other in the Z direction, a side surface R1c and a side surface R1d opposed to each other in the X direction, and a side surface R1e and a side surface R1f opposed to each other in the Y direction as end surfaces thereof. The side surface R1e and the side surface R1f are side surfaces which connect the upper surface R1a with the lower surface R1b and extend in the X direction.

In the embodiment, the upper surface R1a, the lower surface R1b, and the side surfaces R1c, R1d, R1e, and R1f are substantially flat, but each of the surfaces may be curved, or a depression or a protrusion may be provided. The upper surface R1a, the lower surface R1b, and the side surfaces R1c, R1d, R1e, and R1f are parallel to the upper surface 2a, the lower surface 2b, and the side surfaces 2c, 2d, 2e, and 2f, respectively. The first semiconductor region R1 constitutes a central portion of the upper surface 2a and is separated from the lower surface 2b and the side surfaces 2c, 2d, 2e, and 2f. The lower surface R1b and the side surfaces R1c, R1d, R1e, and R1f are respectively separated from the lower surface 2b and the side surfaces 2c, 2d, 2e, and 2f. A thickness (a length in the Z direction) of the first semiconductor region R1 is thinner than a thickness (a length in the Z direction) of the semiconductor layer 2 and is, for example, 10 nm or more and 10 μm or less.

The first semiconductor region R1 has a first portion R11, a second portion R12, and a third portion R13. The first portion R11, the second portion R12, and the third portion R13 are integrally provided with each other. The first portion R11, the second portion R12, and the third portion R13 all constitute a part of the upper surface 2a. The first portion R11 and the second portion R12 are provided to be separated from each other in the X direction. The first portion R11 is provided on the side surface 2c side. The second portion R12 is provided on the side surface 2d side. The third portion R13 is provided between the first portion R11 and the second portion R12 and connects the first portion R11 with the second portion R12. That is, the first portion R11, the third portion R13, and the second portion R12 are linearly arranged in this order in the X direction. All of the first portion R11, the second portion R12, and the third portion R13 constitute a part of the upper surface R1a and a part of the lower surface R1b. The first portion R11, the second portion R12, and the third portion R13 are separated from the side surfaces R1c, R1d, R1e, and R1f.

The second semiconductor region R2 is provided to be separated from the first ferromagnetic layer 3 and the second ferromagnetic layer 4 and to be in contact with at least a part of an end surface of the first semiconductor region R1. The second semiconductor region R2 has a rectangular frame shape when seen in the Z direction and includes a first portion R21 surrounding the first semiconductor region R1, and a second portion R22 disposed below the first semiconductor region R1. A thickness (a length in the Z direction) of the first portion R21 is equal to the thickness (the length in the Z direction) of the semiconductor layer 2. A thickness (the length in the Z direction) of the second portion R22 is thinner than the thickness of the semiconductor layer 2. The sum of the thickness of the second portion R22 and the thickness of the first semiconductor region R1 is equal to the thickness of the semiconductor layer 2.

The second semiconductor region R2 covers surfaces of the first semiconductor region R1 other than the upper surface R1a. The first portion R21 is provided to be in contact with the side surfaces R1c, R1d, R1e, and R1f and covers the side surfaces R1c, R1d, R1e, and R1f. The second portion R22 is provided to be in contact with the lower surface R1b and covers the lower surface R1b. In the embodiment, the second semiconductor region R2 is the entire region of the semiconductor layer 2 other than the first semiconductor region R1. The second semiconductor region R2 constitutes a peripheral portion of the upper surface 2a other than the upper surface R1a, and all of the lower surface 2b and the side surfaces 2c, 2d, 2e, and 2f.

In the case A, the semiconductor layer 2 is formed, for example, by preparing a semiconductor layer having p-type conductivity and locally implanting an n-type dopant in a central portion of an upper surface thereof. A region into which the n-type dopant is implanted is the first semiconductor region R1, and the other region is the second semiconductor region R2. Therefore, an n-type dopant concentration of the first semiconductor region R1 is higher than an n-type dopant concentration of the second semiconductor region R2. A p-type dopant concentration of the first semiconductor region R1 is equal to a p-type dopant concentration of the second semiconductor region R2. For example, a method in which an n-type dopant is disposed on a central portion of an upper surface of a semiconductor layer having p-type conductivity and then thermally diffuses, or the like may be used as a method other than the method of implanting the n-type dopant.

In the case B, the semiconductor layer 2 is formed, for example, by preparing a semiconductor layer having n-type conductivity and locally implanting a p-type dopant in a central portion of an upper surface thereof. A region into which the p-type dopant is implanted is the first semiconductor region R1, and the other region is the second semiconductor region R2. Therefore, a p-type dopant concentration of the first semiconductor region R1 is higher than a p-type dopant concentration of the second semiconductor region R2. An n-type dopant concentration of the first semiconductor region R1 is equal to an n-type dopant concentration of the second semiconductor region R2. For example, a method in which a p-type dopant is disposed on a central portion of an upper surface of a semiconductor layer having n-type conductivity and then thermally diffuses, or the like may be used as a method other than the method of implanting the p-type dopant.

Figure 3A:
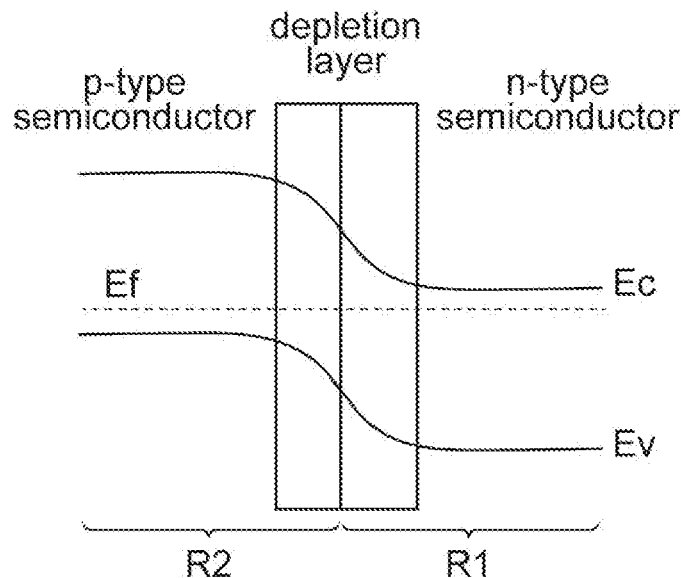
FIGS. 3A and 3B are energy band diagrams in the vicinity of an interface between a first semiconductor region and a second semiconductor region of a magnetoresistance effect element of the first embodiment.
Figure 3B:
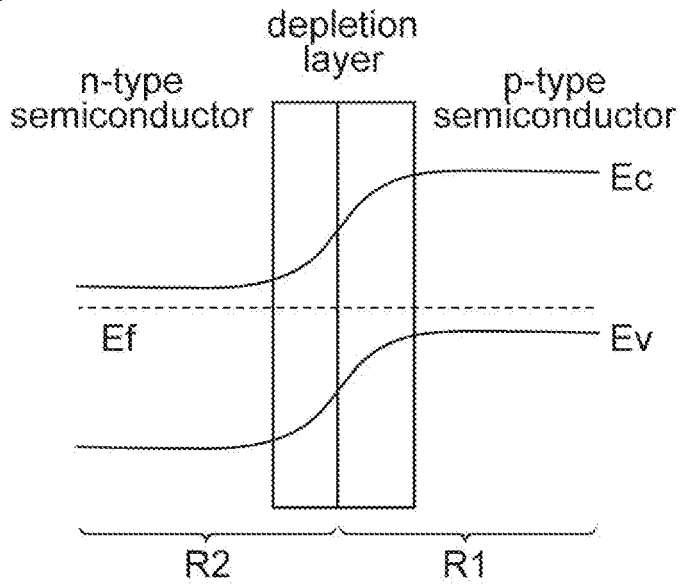

FIG. 3A is an energy band diagram in the vicinity of an interface between the first semiconductor region R1 and the second semiconductor region R2 in the case A when no bias is applied, and FIG. 3B is an energy band diagram in the vicinity of the interface between the first semiconductor region R1 and the second semiconductor region R2 in the case B when no bias is applied. In FIGS. 3A and 3B, Ec indicates the lowest level of a conduction band, Ef indicates a Fermi level, and Ev indicates the highest level of a valence band. As described above, the first semiconductor region R1 and the second semiconductor region R2 have conductivity types different from each other. Therefore, a depletion layer is formed in the vicinity of the interface between the first semiconductor region R1 and the second semiconductor region R2 by forming a pn junction between the first semiconductor region R1 and the second semiconductor region R2.

As shown in FIGS. 1 and 2, the first ferromagnetic layer 3 and the second ferromagnetic layer 4 are provided on the upper surface 2a of the semiconductor layer 2 to be separated from each other in the X direction. That is, a separating direction of the first ferromagnetic layer 3 and the second ferromagnetic layer 4 is the X direction. The first ferromagnetic layer 3 is provided on the first portion R11. The first ferromagnetic layer 3 is provided to cover an upper surface of the first portion R11. When seen in the Z direction, the entire first ferromagnetic layer 3 overlaps the entire first portion R11. The second ferromagnetic layer 4 is provided on the second portion R12. The second ferromagnetic layer 4 is provided to cover an upper surface of the second portion R12. When seen in the Z direction, the entire second ferromagnetic layer 4 overlaps the entire second portion R12.

The upper surface of the first portion R11 is a portion of the upper surface R1a which overlaps the first ferromagnetic layer 3 when seen in the Z direction. A side surface of the first portion R11 extends from an outer edge of the upper surface of the first portion R11 in the Z direction. Both ends of the first portion R11 in the X direction coincide with both ends of the first ferromagnetic layer 3 in the X direction. Both ends of the first portion R11 in the Y direction coincide with both ends of the first ferromagnetic layer 3 in the Y direction. The upper surface of the second portion R12 is a portion of the upper surface R1a which overlaps the second ferromagnetic layer 4 when seen in the Z direction. A side surface of the second portion R12 extends from an outer edge of the upper surface of the second portion R12 in the Z direction. Both ends of the second portion R12 in the X direction coincide with both ends of the second ferromagnetic layer 4 in the X direction. Both ends of the second portion R12 in the Y direction coincide with both ends of the second ferromagnetic layer 4 in the Y direction.

One of the first ferromagnetic layer 3 and the second ferromagnetic layer 4 serves as a magnetization fixed layer, and the other one of the first ferromagnetic layer 3 and the second ferromagnetic layer 4 serves as a magnetization free layer. Although the example in which the first ferromagnetic layer 3 serves as a magnetization free layer, and the second ferromagnetic layer 4 serves as a magnetization fixed layer has been described in the embodiment, the first ferromagnetic layer 3 may serve as the magnetization fixed layer, and the second ferromagnetic layer 4 may serve as the magnetization free layer.

The first ferromagnetic layer 3 and the second ferromagnetic layer 4 are composed of a ferromagnetic material. For example, a metal or an alloy having at least one element selected from Ni, Fe and Co may be used as the ferromagnetic material of the first ferromagnetic layer 3 and the second ferromagnetic layer 4. More specifically, a Co—Fe alloy, a Ni—Fe alloy, a Co—B alloy, an Fe—B alloy or a Co—Fe—B alloy may be used. A Heusler alloy such as a Co—Fe—Al alloy, a Co—Fe—Si alloy, a Co—Mn—Si alloy, a Co—Mn—Ge alloy, a Co—Fe—Al—Si alloy, or a Co—Fe—Ga—Ge alloy may be used. A coercive force of the second ferromagnetic layer 4 in a direction in which an external magnetic field is applied is larger than a coercive force of the first ferromagnetic layer 3 in the direction in which an external magnetic field is applied. For example, the coercive force of the second ferromagnetic layer 4 may be larger than the coercive force of the first ferromagnetic layer 3 due to selecting a hard magnetic material for the second ferromagnetic layer 4 and selecting a soft magnetic material for the first ferromagnetic layer 3. The coercive force of the second ferromagnetic layer 4 may be larger than the coercive force of the first ferromagnetic layer 3 due to exchange-coupling the second ferromagnetic layer 4 to an antiferromagnetic layer.

The first insulating layer 5 and the second insulating layer 6 are insulating films which develop a tunnel magnetoresistance effect (a coherent tunnel effect). The first insulating layer 5 is provided on the first portion R11. The first insulating layer 5 is in contact with the upper surface of the first portion R11. The first insulating layer 5 is provided between the first portion R11 and the first ferromagnetic layer 3. That is, the first ferromagnetic layer 3 is provided on the first portion R11 with the first insulating layer 5 interposed therebetween. The second insulating layer 6 is provided on the second portion R12. The second insulating layer 6 is in contact with the upper surface of the second portion R12. The second insulating layer 6 is provided between the second portion R12 and the second ferromagnetic layer 4. That is, the second ferromagnetic layer 4 is provided on the second portion R12 with the second insulating layer 6 interposed therebetween. According to the first insulating layer 5 and the second insulating layer 6, spin injection efficiency and spin extraction efficiency are improved.

Film thicknesses of the first insulating layer 5 and the second insulating layer 6 can be set to 3 nm or less from the viewpoint of suppressing an increase in resistance and making it serve as a tunnel insulating layer. The film thicknesses of the first insulating layer 5 and the second insulating layer 6 can be set to 0.4 nm or more in consideration of a thickness of one atomic layer. The first insulating layer 5 and the second insulating layer 6 are composed of, for example, magnesium oxide. When the first insulating layer 5 and the second insulating layer 6 are composed of magnesium oxide, the spin injection efficiency and the spin extraction efficiency are particularly improved.

The current source 20 and the voltage measurement unit 30 are electrically connected to the magnetoresistance effect element 1A. One end of each of the current source 20 and the voltage measurement unit 30 is electrically connected to the first ferromagnetic layer 3, and the other end of each of the current source 20 and the voltage measurement unit 30 is electrically connected to the second ferromagnetic layer 4.

The current source 20 is a means for causing a current to flow between the second ferromagnetic layer 4 and the first ferromagnetic layer 3. For example, the current source 20 may supply a constant current flowing in the first semiconductor region R1 from the second ferromagnetic layer 4 toward the first ferromagnetic layer 3. The current source 20 may supply a constant current flowing in the first semiconductor region R1 from the first ferromagnetic layer 3 toward the second ferromagnetic layer 4. The voltage measurement unit 30 is a means for measuring a voltage between the first ferromagnetic layer 3 and the second ferromagnetic layer 4.

In the magnetic sensor 10A, when a current is supplied by the current source 20, carriers having spins corresponding to a magnetization direction of the first ferromagnetic layer 3 are injected from the first ferromagnetic layer 3 serving as a magnetization free layer into the first portion R11. The carriers are electrons in the case A and holes in the case B. The injected spin-polarized carriers transport through the first semiconductor region R1, and the spins corresponding to the magnetization direction of the first ferromagnetic layer 3 are accumulated mainly in the second portion R12 in the vicinity of the upper surface 2a. Electrical resistance between the second ferromagnetic layer 4 and the second portion R12 changes according to a relative angle between a direction of the spins accumulated in the second portion R12 and the magnetization direction of the second ferromagnetic layer 4 (magnetoresistance effect). A spin output voltage corresponding to the change in the relative angle is generated between the first ferromagnetic layer 3 and the second ferromagnetic layer 4. Therefore, the magnetization direction of the first ferromagnetic layer 3 can be detected as a direction or magnitude of an external magnetic field by measuring the voltage between the first ferromagnetic layer 3 and the second ferromagnetic layer 4 with the voltage measurement unit 30. In addition to the spin output voltage, a voltage including a voltage drop due to a resistance of the semiconductor layer 2, a resistance of the first ferromagnetic layer 3, a resistance of the second ferromagnetic layer 4, a resistance between the first ferromagnetic layer 3 and the semiconductor layer 2 and a resistance between the second ferromagnetic layer 4 and the semiconductor layer 2 is measured in the voltage measurement unit 30.

In the magnetoresistance effect element 1A, as described above, the depletion layer is formed at the interface between the first semiconductor region R1 and the second semiconductor region R2 by forming the pn junction between the first semiconductor region R1 and the second semiconductor region R2. As a result, since transporting of the spin-polarized carriers in the vicinity of the interface between the first semiconductor region R1 and the second semiconductor region R2 is suppressed, capturing or scattering of the spin polarized carriers by an interface trap near the interface is suppressed. As a result, it is possible to increase a spin diffusion length and a spin lifetime of the spin-polarized carriers transporting in the first semiconductor region R1. From these facts, since a spin accumulation effect in the first semiconductor region R1 (particularly, the second portion R12) can be increased, it is possible to increase the magnetoresistance effect generated between the second ferromagnetic layer 4 and the semiconductor layer 2. As a result, since an output signal can be made larger, it is possible to obtain a SN ratio larger than a conventional one.

The magnetoresistance effect element 1A includes the wiring 45, and a reverse bias voltage is applied between the first semiconductor region R1 and the second semiconductor region R2 through the wiring 45. The wiring 45 is used in the case A to apply a voltage in a direction such that the first semiconductor region R1 becomes positive (+) and the second semiconductor region R2 becomes negative (−) and used in the case B to apply a voltage in a direction such that the first semiconductor region R1 becomes negative (−) and the second semiconductor region R2 becomes positive (+). In other words, the wiring 45 is used to apply a reverse bias voltage between the first semiconductor region R1 and the second semiconductor region R2 and to widen a width of the depletion layer formed in the vicinity of the interface between the first semiconductor region R1 and the second semiconductor region R2. The wiring 45 is connected to the second semiconductor region R2. In FIGS. 1 and 2, the wiring 45 is connected to the first portion R21 of the second semiconductor region R2 and the voltage source 50, but may be connected to the second portion R22 and the voltage source 50.

Figure 4A:
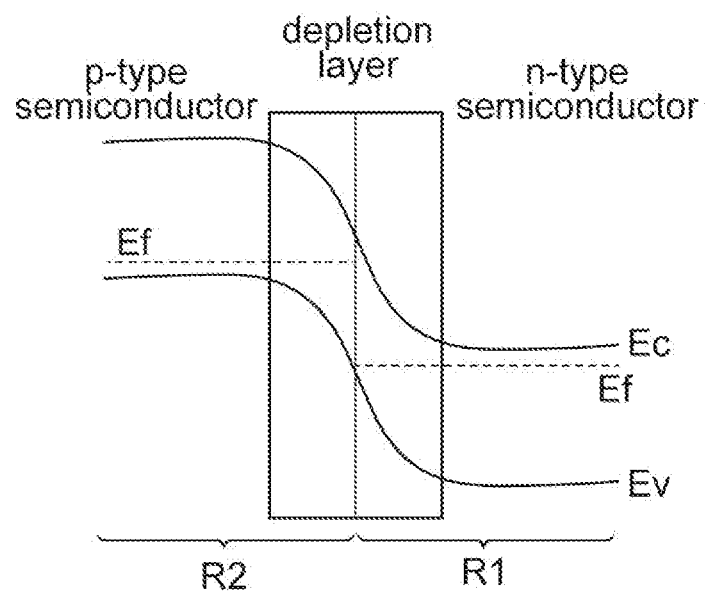
FIGS. 4A and 4B are energy band diagrams in the vicinity of the interface between the first semiconductor region and the second semiconductor region when a reverse bias voltage is applied to the magnetoresistance effect element of the first embodiment.
Figure 4B:
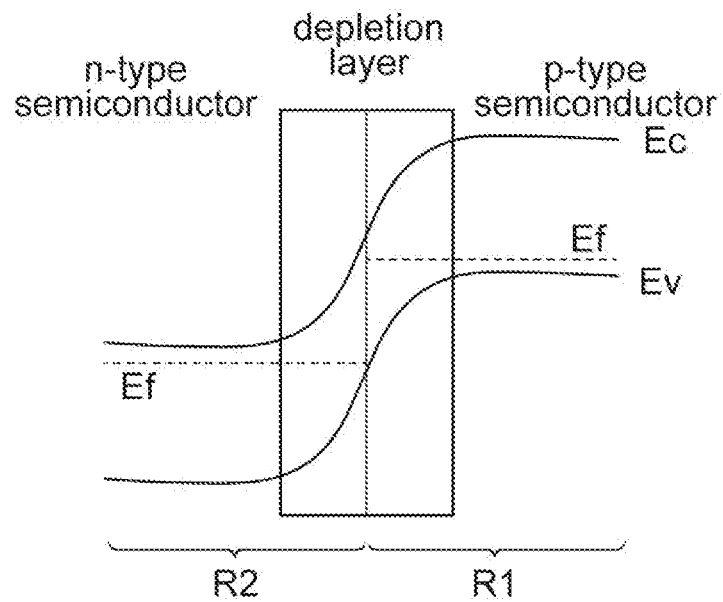

FIG. 4A is an energy band diagram of the vicinity of the interface between the first semiconductor region R1 and the second semiconductor region R2 in the case A when the reverse bias voltage is applied, and FIG. 4B is an energy band diagram of the vicinity of the interface between the first semiconductor region R1 and the second semiconductor region R2 in the case B when the reverse bias voltage is applied. In FIGS. 4A and 4B, Ec indicates the lowest level of a conduction band, Ef indicates a Fermi level, and Ev indicates the highest level of a valence band. As shown in FIGS. 4A and 4B, when a voltage in the direction of making the n-type semiconductor positive (+) and the p-type semiconductor negative (−) is applied through the wiring 45 (refer to FIG. 1), the width of the depletion layer widens.

In the case A, since the conductivity type of the first semiconductor region R1 is n-type, and the conductivity type of the second semiconductor region R2 is p-type, when a voltage in the direction such that the first semiconductor region R1 becomes positive (+) and the second semiconductor region R2 becomes negative (−) is applied, the width of the depletion layer widens. In the case B, since the conductivity type of the first semiconductor region R1 is p-type, and the conductivity type of the second semiconductor region R2 is n-type, when a voltage in the direction such that the first semiconductor region R1 becomes negative (−) and the second semiconductor region R2 becomes positive (+) is applied, the width of the depletion layer widens. Thus, capturing or scattering of the carriers by the interface trap is further suppressed. As a result, it is possible to obtain a SN ratio larger than the conventional one.

In the magnetoresistance effect element 1A, the first portion R21 of the second semiconductor region R2 is provided to be in contact with the side surfaces R1c, R1d, R1e, and R1f of the first semiconductor region R1. Thus, a depletion layer is formed in the vicinity of the interface between the side surfaces R1c, R1d, R1e, and R1f of the first semiconductor region R1 and the first portion R21 of the second semiconductor region R2. A thickness of the first portion R21 is equal to a thickness of the semiconductor layer 2. Therefore, the depletion layer is formed over the entire side surfaces R1c, R1d, R1e, and R1f of the first semiconductor region R1 in the Z direction. The second portion R22 is provided to be in contact with the lower surface R1b of the first semiconductor region R1. Therefore, the depletion layer is formed in the vicinity of the interface between the lower surface R1b of the first semiconductor region R1 and the second portion R22 of the second semiconductor region R2. From these facts, since an influence of the interface trap on the carriers and the spins is further suppressed, it is possible to obtain a SN ratio larger than the conventional one. In particular, the side surfaces of the semiconductor layer 2 may be formed due to patterning by ion milling, etching or the like. In this case, the interface trap tends to increase in the side surfaces. According to the configuration in which the first portion R21 of the second semiconductor region R2 is provided to be in contact with the side surfaces R1c, R1d, R1e, and R1f of the first semiconductor region R1, an influence of the interface trap on the side surfaces can be effectively suppressed.

The first portion R11, the second portion R12, and the third portion R13 are portions of the first semiconductor region R1 in which many carriers transport. Since the carriers move in the X direction, a flow of carriers in a portion of the first semiconductor region R1 adjacent to the first portion R11, the second portion R12, and the third portion R13 in the X direction is small, but a flow of carriers in a portion thereof adjacent to the first portion R11, the second portion R12, and the third portion R13 in the Y direction is large. Therefore, in the magnetoresistance effect element 1A, the first portion R21 of the second semiconductor region R2 is provided to be in contact with at least a part (here, the whole) of the side surfaces R1e and R1f of the first semiconductor region R1. Thus, the influence of the interface trap can be suppressed more effectively.

The first portion R21 of the second semiconductor region R2 is provided to overlap at least a portion (here, the whole) of the first portion R11, the second portion R12, and the third portion R13 of the first semiconductor region R1 when seen in a direction (here, the Y direction) intersecting with (here, orthogonal to) the side surfaces R1e and R1f. Thus, the influence of the interface trap can be suppressed more effectively.

Since the magnetic sensor 10A includes the magnetoresistance effect element 1A, it is possible to obtain a SN ratio larger than the conventional one.

Second Embodiment

Figure 5:
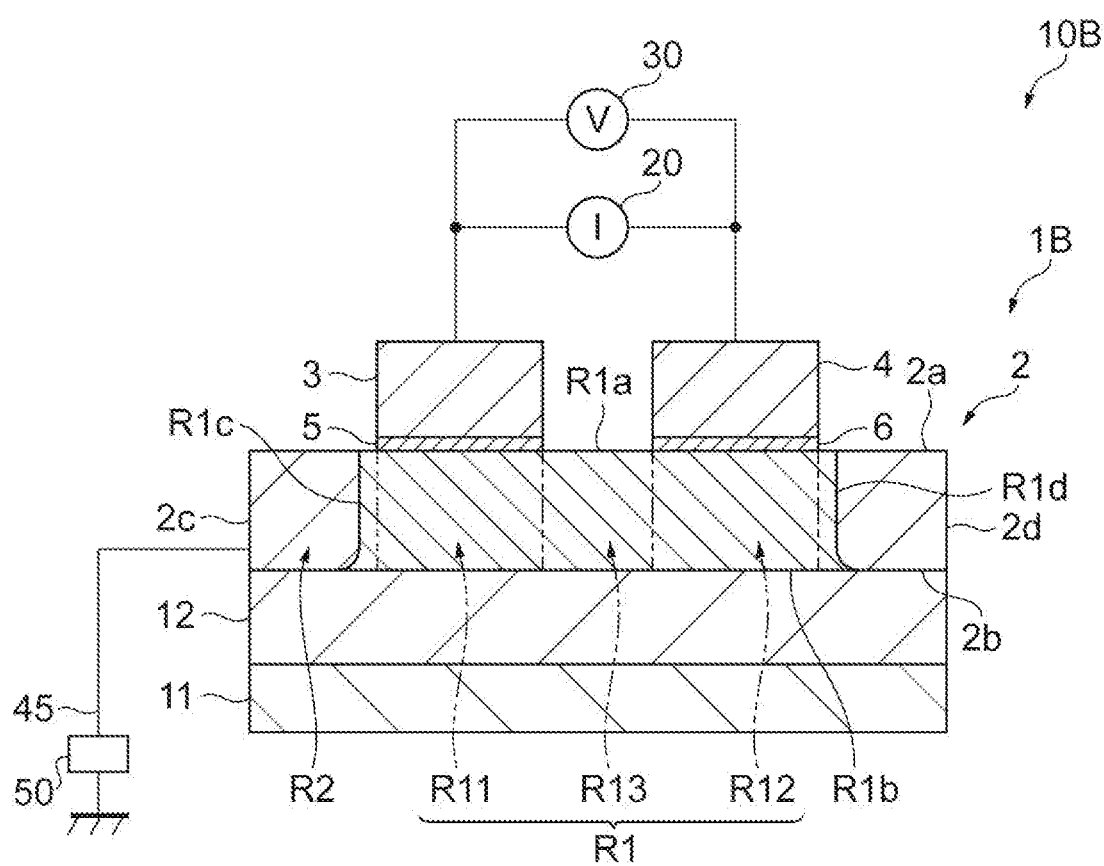
FIG. 5 is a cross-sectional view of a magnetic sensor according to a second embodiment.
Figure 6:
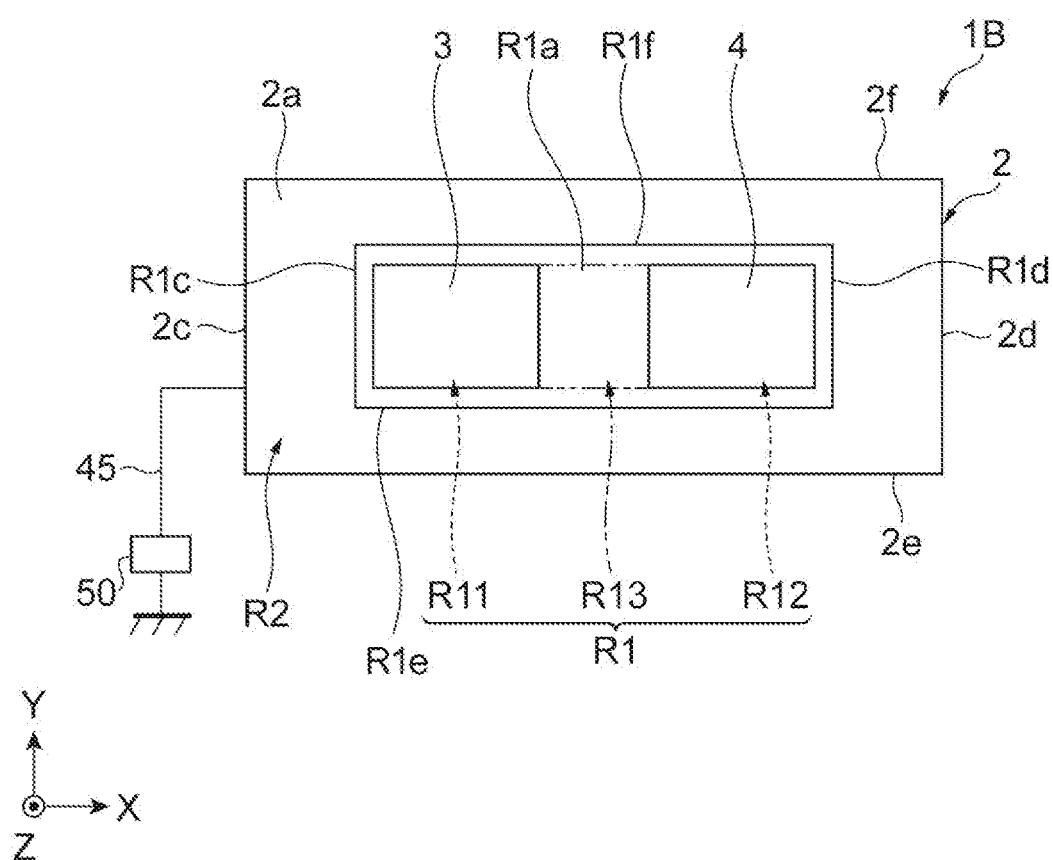
FIG. 6 is a top view of the magnetic sensor shown in FIG. 5.

A magnetoresistance effect element 1B and a magnetic sensor 10B according to a second embodiment will be described with reference to FIGS. 5 and 6 focusing on differences from the magnetoresistance effect element 1A and the magnetic sensor 10A (refer to FIGS. 1 and 2) according to the first embodiment. FIG. 5 is a cross-sectional view of the magnetic sensor according to the second embodiment. FIG. 6 is a top view of the magnetic sensor shown in FIG. 5. In FIGS. 5 to 6, an orthogonal coordinate system is shown. In FIG. 6, the current source 20 and the voltage measurement unit 30 are not shown.

The magnetoresistance effect element 1B shown in FIG. 5 and FIG. 6 further includes a support substrate 11 and an insulating layer 12. The support substrate 11 is formed of, for example, a semiconductor material such as Si. The insulating layer 12 is formed of, for example, an oxide such as a silicon oxide ($SiO_2$). The insulating layer 12 is provided on an upper surface of the support substrate 11 and covers the upper surface of the support substrate 11. The insulating layer 12 is provided between the upper surface of the support substrate 11 and the lower surface 2b of the semiconductor layer 2. That is, the insulating layer 12 is in contact with each of the upper surface of the support substrate 11 and the lower surface 2b of the semiconductor layer 2. The upper surface 2a of the semiconductor layer 2 is a surface of the semiconductor layer 2 opposite to the insulating layer 12. The support substrate 11, the insulating layer 12, and the semiconductor layer 2 may be a so-called a silicon-on-insulator (SOI) substrate, a germanium-on-insulator (GOI) substrate, or a silicon-germanium-on-insulator (SGOI) substrate. The insulating layer 12 is a so-called buried oxide (BOX) layer.

In the magnetoresistance effect element 1B, thicknesses (lengths in the Z direction) of the first portion R11, the second portion R12 and the third portion R13 of the first semiconductor region R1 are all equal to a thickness (a length in the Z direction) of the semiconductor layer 2. The lower surface R1$b$ of the first semiconductor region R1 constitutes a central portion of the lower surface 2$b$. The lower surface R1$b$ is in contact with the insulating layer 12.

The second semiconductor region R2 has a rectangular frame shape when seen in the Z direction and surrounds the first semiconductor region R1. The second semiconductor region R2 is in contact with the side surfaces R1$c$, R$d$, R1$e$, and R1$f$ of the first semiconductor region R1. A thickness (a length in the Z direction) of the second semiconductor region R2 is equal to the thickness (the length in the Z direction) of the semiconductor layer 2. A lower surface of the second semiconductor region R2 constitutes a part of the lower surface 2$b$ and is in contact with the insulating layer 12. In the embodiment, the second semiconductor region R2 constitutes a peripheral portion of the upper surface 2$a$ other than the upper surface R1$a$, a peripheral portion of the lower surface 2$b$ other than the lower surface R1$b$, and all of the side surfaces 2$c$, 2$d$, 2$e$, and 2$f$.

In the case A, the semiconductor layer 2 is formed, for example, by preparing a semiconductor layer having n-type conductivity and locally implanting a p-type dopant from an upper surface of the semiconductor layer. A region into which the p-type dopant is implanted is the second semiconductor region R2, and the other region is the first semiconductor region R1. Therefore, a p-type dopant concentration of the first semiconductor region R1 is lower than a p-type dopant concentration of the second semiconductor region R2. For example, a method in which a p-type dopant is disposed on the upper surface or the side surface of the semiconductor layer and then thermally diffuses, or the like may be used as a method other than the method of implanting the p-type dopant. In the first semiconductor region R1 having n-type conductivity, the p-type dopant present inside the first semiconductor region R1 may be small because the p-type dopant is a factor which causes the carriers (the electrons) to be captured or scattered. That is, capturing or scattering of the carriers inside the first semiconductor region R1 is suppressed as compared with a case in which the p-type dopant concentration in the first semiconductor region R1 is equal to the p-type dopant concentration in the second semiconductor region R2. As a result, it is possible to obtain a SN ratio larger than the conventional one. The n-type dopant concentration in the first semiconductor region R1 is equal to the n-type dopant concentration in the second semiconductor region R2.

In the case B, the semiconductor layer 2 is formed, for example, by preparing a semiconductor layer having p-type conductivity and locally implanting an n-type dopant from an upper surface of the semiconductor layer. A region into which the n-type dopant is implanted is the second semiconductor region R2, and the other region is the first semiconductor region R1. Therefore, an n-type dopant concentration of the first semiconductor region R1 is lower than an n-type dopant concentration of the second semiconductor region R2. For example, a method in which an n-type dopant is disposed on the upper surface or the side surface of the semiconductor layer and then thermally diffuses, or the like may be used as a method other than the method of implanting the n-type dopant. In the first semiconductor region R1 having p-type conductivity, the n-type dopant present inside the first semiconductor region R1 may be small because the n-type dopant is a factor which causes the carriers (the holes) to be captured or scattered. That is, capturing or scattering of the carriers inside the first semiconductor region R1 is suppressed as compared with a case in which the n-type dopant concentration in the first semiconductor region R1 is equal to the n-type dopant concentration in the second semiconductor region R2. As a result, it is possible to obtain a SN ratio larger than the conventional one. The p-type dopant concentration in the first semiconductor region R1 is equal to the p-type dopant concentration in the second semiconductor region R2.

Also in the magnetoresistance effect element 1B, as in the magnetoresistance effect element 1A (refer to FIG. 1), the depletion layer is formed in the vicinity of the interface between the first semiconductor region R1 and the second semiconductor region R2. As a result, since the transporting of the spin-polarized carriers in the vicinity of the interface between the first semiconductor region R1 and the second semiconductor region R2 is suppressed, capturing or scattering of the spin polarized carriers by an interface trap in the vicinity of the interface is suppressed. As a result, it is possible to increase a spin diffusion length and a spin lifetime of the spin-polarized carriers transporting in the first semiconductor region R1. From these facts, since the spin accumulation effect in the first semiconductor region R1 (particularly, the second portion R12) can be increased, it is possible to increase the magnetoresistance effect generated between the second ferromagnetic layer 4 and the semiconductor layer 2. As a result, since an output signal can be increased, it is possible to obtain a SN ratio larger than the conventional one.

In the magnetoresistance effect element 1B, the second semiconductor region R2 is provided to be in contact with the side surfaces R1$c$, R1$d$, R1$e$, and R1$f$ of the first semiconductor region R1. Thus, the depletion layer is formed in the vicinity of the interface between the side surfaces R1$c$, R1$d$, R1$e$ and R1$f$ of the first semiconductor region R1 and the second semiconductor region R2. The thickness of the second semiconductor region R2 is equal to the thickness of the semiconductor layer 2. Therefore, the depletion layer is formed over the entire side surfaces R1$c$, R1$d$, R1$e$, and R1$f$ of the first semiconductor region R1 in the Z direction. From these facts, since the influence of the interface trap on the carriers and the spins is further suppressed, it is possible to obtain a larger SN ratio than the conventional one.

Also in the magnetic sensor 10B, as in the magnetic sensor 10A (refer to FIG. 1), the magnetization direction of the first ferromagnetic layer 3 can be detected as a direction or magnitude of an external magnetic field by supplying a current from the current source 20 and measuring the voltage between the first ferromagnetic layer 3 and the second ferromagnetic layer 4 with the voltage measurement unit 30. Since the magnetic sensor 10B includes the magnetoresistance effect element 1B, it is possible to obtain a SN ratio larger than the conventional one.

Third Embodiment

A magnetoresistance effect element 1C and a magnetic sensor 10C according to a third embodiment will be described with reference to FIGS. 7 and 8 focusing on differences from the magnetoresistance effect element 1B and the magnetic sensor 10B (refer to FIGS. 5 and 6)

according to the second embodiment. FIG. 7 is a cross-sectional view of the magnetic sensor according to the third embodiment. FIG. 8 is a top view of the magnetic sensor shown in FIG. 7. In FIGS. 7 to 8, an orthogonal coordinate system is shown. In FIG. 8, the current source 20 and the voltage measurement unit 30 are not shown.

Figure 7:
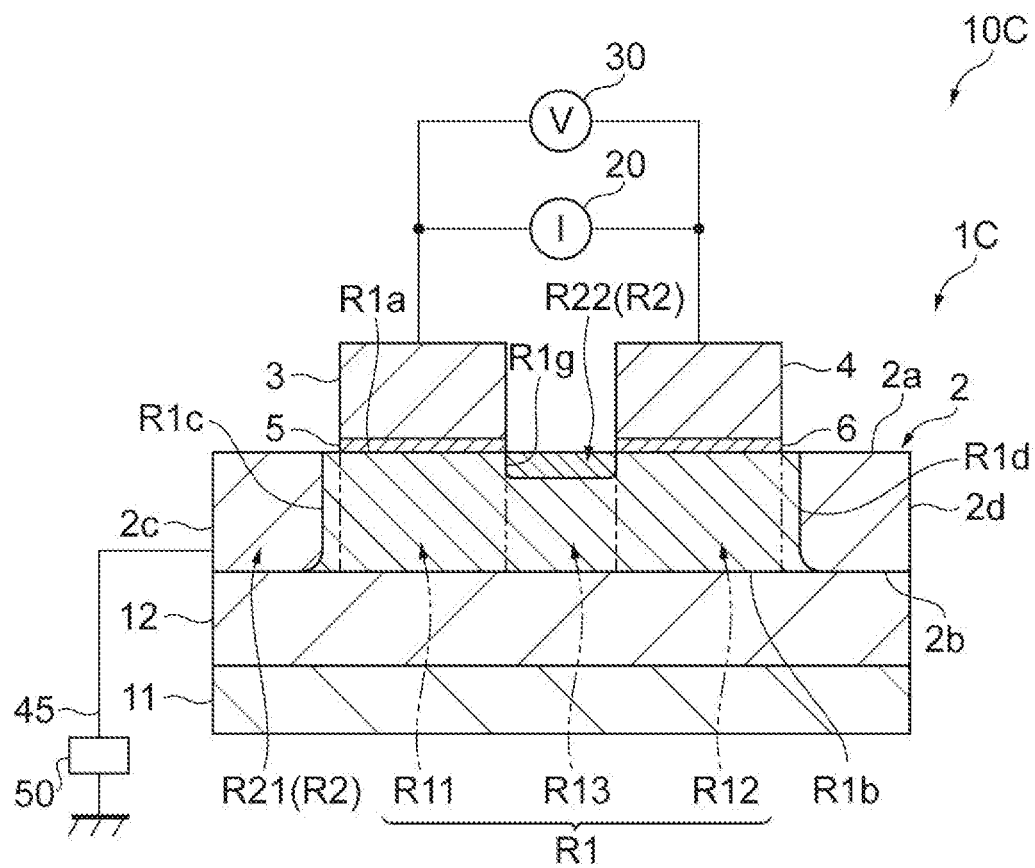
FIG. 7 is a cross-sectional view of a magnetic sensor according to a third embodiment.
Figure 8:
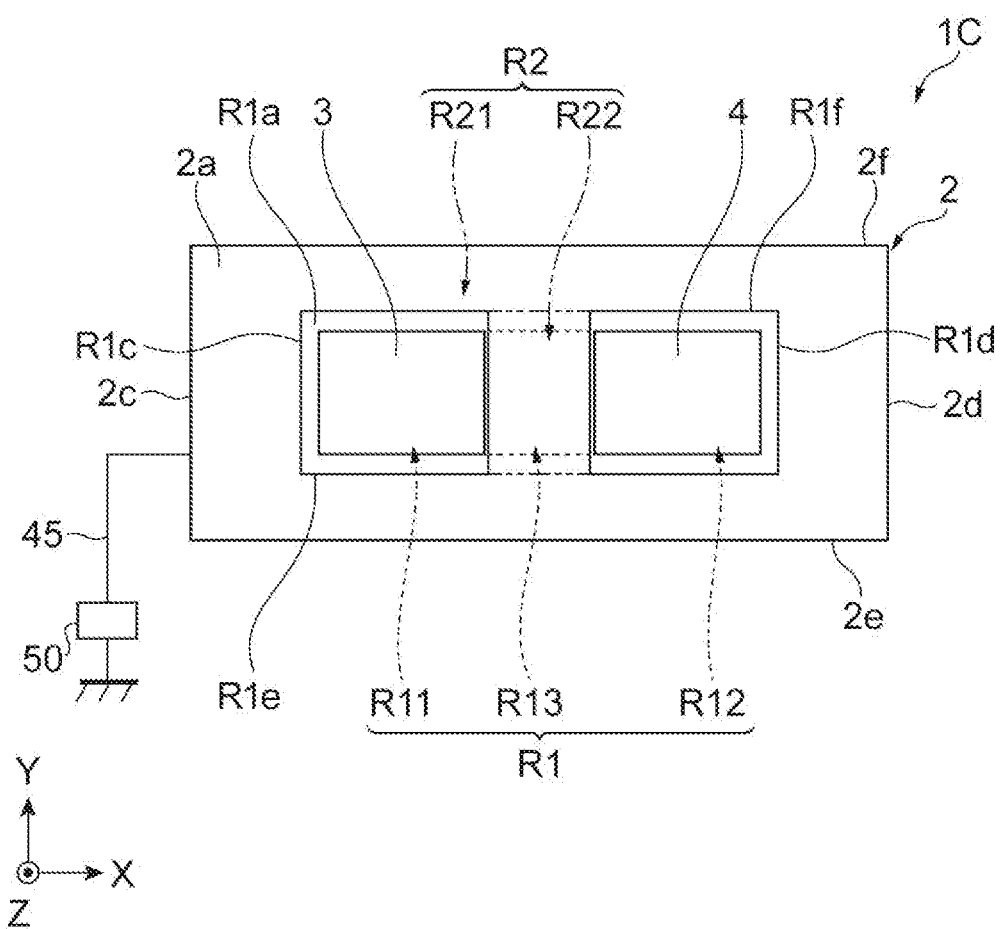
FIG. 8 is a top view of the magnetic sensor shown in FIG. 7.

As shown in FIGS. 7 and 8, in the magnetoresistance effect element 1C, a depression R1g is provided on the upper surface 2a of the semiconductor layer 2. An inner surface of the depression R1g constitutes a part of the upper surface R1a of the first semiconductor region R1. The inner surface of the depression R1g has a bottom surface and side surfaces of the depression R1g. The bottom surface of the depression R1g constitutes an upper surface of the third portion R13. The second semiconductor region R2 has a first portion R21 which has a rectangular frame shape and surrounds the first semiconductor region R1, and a second portion R22 which is provided to be in contact with the inner surface of the depression R1g. The first portion R21 corresponds to the second semiconductor region R2 in the magnetoresistance effect element 1B (refer to FIG. 5).

The second portion R22 is in contact with at least a part of a region of the upper surface R1a between the first ferromagnetic layer 3 and the second ferromagnetic layer 4 when seen in a thickness direction (the Z direction) of the semiconductor layer 2. The second portion R22 is provided to be sandwiched between the first ferromagnetic layer 3 and the second ferromagnetic layer 4 when seen in the Z direction. The second portion R22 constitutes a part of the upper surface 2a. A thickness (a length in the Z direction) of the second portion R22 is equal to a depth (a length in the Z direction) of the depression R1g and is, for example, 10 nm or more and 1 µm or less. Both ends of the second portion R22 in the Y direction are connected to the first portion R21. As a method of forming the second portion R22, there is, for example, a method in which the n-type dopant or the p-type dopant is disposed on the surface of the semiconductor layer 2 and thermally diffuses other than a method in which the n-type dopant or the p-type dopant is locally implanted from the upper surface of the semiconductor layer.

The wiring 45 is connected to the first portion R21 and the voltage source 50 but may be connected to the second portion R22 and the voltage source 50. Since the first portion R21 and the second portion R22 are connected to each other, according to the wiring 45, the same voltage can be applied to both the first portion R21 and the second portion R22.

Also in the magnetoresistance effect element 1C, as in the magnetoresistance effect element 1B (refer to FIG. 5), the depletion layer is formed in the vicinity of the interface between the first semiconductor region R1 and the second semiconductor region R2. Thus, the influence of the interface trap on the carriers and the spins is suppressed, and it is possible to obtain a SN ratio larger than the conventional one. Most of the carriers transport through the third portion R13. In the magnetoresistance effect element 1C, the second portion R22 is provided to be in contact with at least a part of the upper surface R1a, and the depletion layer is formed in the vicinity of the interface between the second portion R22 and the third portion R13. Therefore, the influence of the interface trap at the upper surface R1a on the carriers and the spins can be effectively suppressed. As a result, it is possible to obtain a larger SN ratio.

Since the magnetic sensor 10C includes the magnetoresistance effect element 1C, it is possible to obtain a SN ratio larger than the conventional one.

Fourth Embodiment

Figure 9:
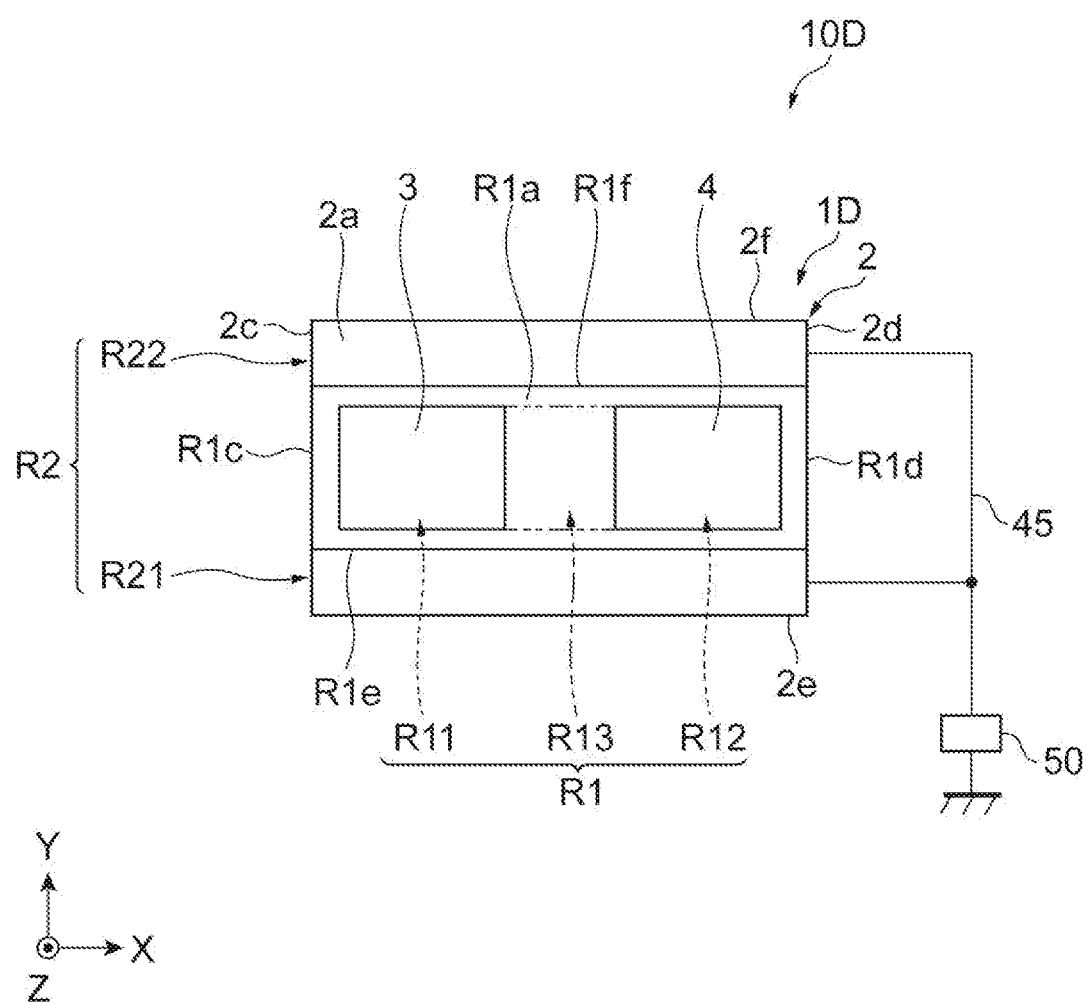
FIG. 9 is a top view of a magnetic sensor according to a fourth embodiment.

A magnetoresistance effect element 1D and a magnetic sensor 10D according to a fourth embodiment will be described with reference to FIG. 9 focusing on differences from the magnetoresistance effect element 1B and the magnetic sensor 10B (refer to FIGS. 5 and 6) according to the second embodiment. FIG. 9 is a top view of the magnetic sensor according to the fourth embodiment. In FIG. 9, an orthogonal coordinate system is shown. In FIG. 9, the current source 20 and the voltage measurement unit 30 (refer to FIG. 5) are not shown.

As shown in FIG. 9, in the magnetoresistance effect element 1D, the second semiconductor region R2 does not have a rectangular frame shape when seen in the Z direction and has a first portion R21 and a second portion R22 which linearly extend in the X direction. The first portion R21 and the second portion R22 are provided to sandwich the first semiconductor region R1 in the Y direction. The first portion R21 is provided to be in contact with the side surface R1e. The second portion R22 is provided to be in contact with the side surface R1f. In the embodiment, the upper surface R1a is a central portion of the upper surface 2a in the Y direction, and the lower surface R1b is a central portion of the lower surface 2b in the Y direction. The first semiconductor region R1 also constitutes a central portion of each of the side surface 2c and the side surface 2d in the Y direction. The second semiconductor region R2 constitutes a portion of the upper surface 2a other than the upper surface R1a, a portion of the lower surface 2b other than the lower surface R1b, a portion of each of the side surface 2c and the side surface 2d on the side surface 2e side, and a portion of each of the side surface 2c and the side surface 2d on the side surface 2f side.

The wire 45 is connected to be able to apply the same voltage to both the first portion R21 and the second portion R22.

Also in the magnetoresistance effect element 1D, as in the magnetoresistance effect element 1B (refer to FIG. 5), the depletion layer is formed in the vicinity of the interface between the first semiconductor region R1 and the second semiconductor region R2. Therefore, the influence of the interface trap on the carriers and the spins is suppressed, and a SN ratio larger than the conventional one can be obtained. As a result, it is possible to obtain a SN ratio larger than the conventional one.

Since the magnetic sensor 10D includes the magnetoresistance effect element 1D, it is possible to obtain a SN ratio larger than the conventional one.

Fifth Embodiment

Figure 10:
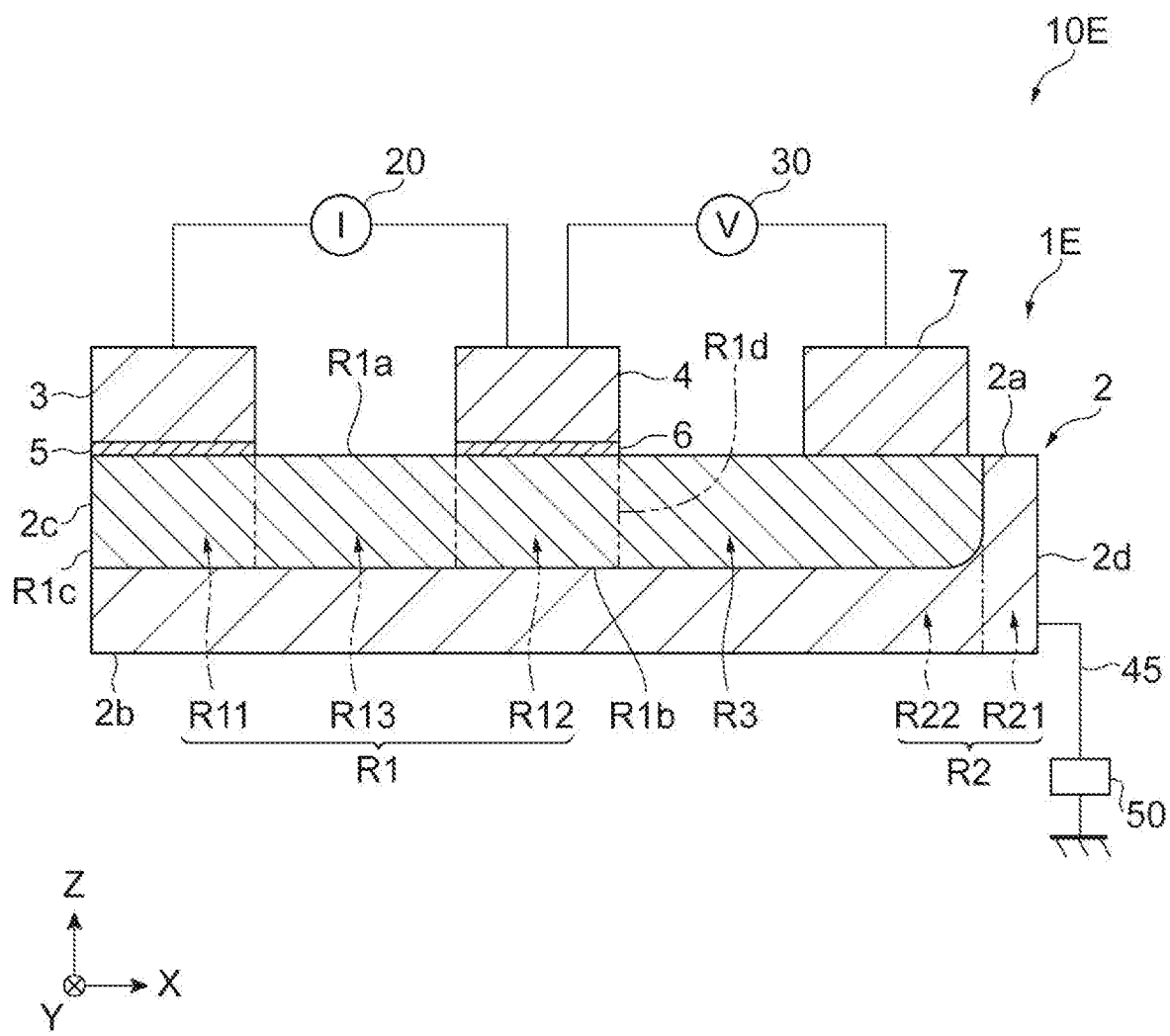
FIG. 10 is a cross-sectional view of a magnetic sensor according to a fifth embodiment.
Figure 11:
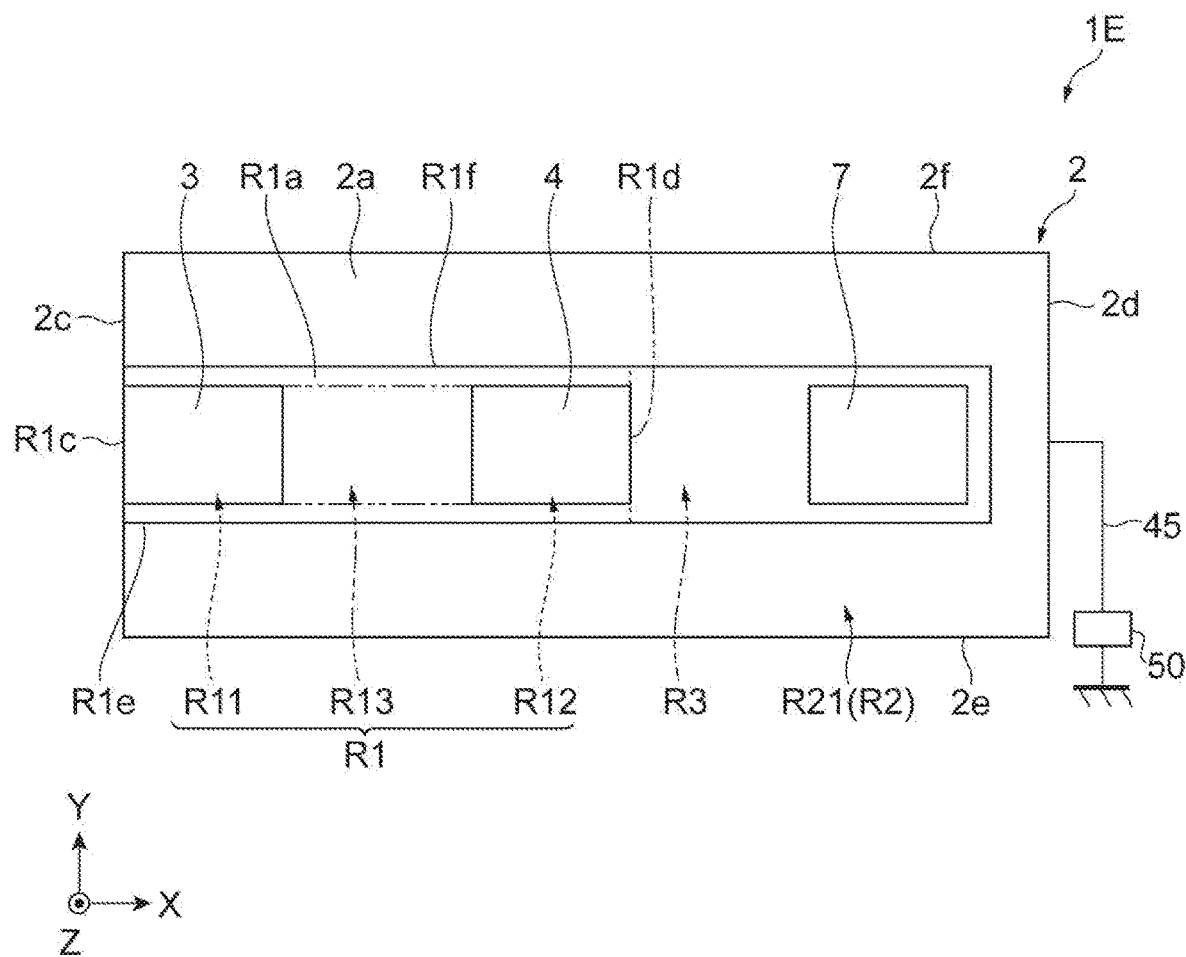
FIG. 11 is a top view of the magnetic sensor shown in FIG. 10.

A magnetoresistance effect element 1E and a magnetic sensor 10E according to a fifth embodiment will be described with reference to FIGS. 10 and 11 focusing on differences from the magnetoresistance effect element 1A and the magnetic sensor 10A (refer to FIGS. 1 and 2) according to the first embodiment. FIG. 10 is a cross-sectional view of the magnetic sensor according to the fifth embodiment. FIG. 11 is a top view of the magnetic sensor shown in FIG. 10. In FIGS. 10 to 11, an orthogonal coordinate system is shown. In FIG. 11, the current source 20 and the voltage measurement unit 30 are not shown.

As shown in FIGS. 10 and 11, the magnetic sensor 10E includes the magnetoresistance effect element 1E and is connected to the current source 20 and the voltage measurement unit 30. The magnetoresistance effect element 1E further includes a reference electrode 7 in addition to the semiconductor layer 2, the first ferromagnetic layer 3, the second ferromagnetic layer 4, the first insulating layer 5, the second insulating layer 6, and the wiring 45. In FIGS. 10 and 11, the wiring 45 is connected to the first portion R21 and the voltage source 50 but may be connected to the second portion R22 and the voltage source 50.

The semiconductor layer 2 further includes a third semiconductor region R3. The third semiconductor region R3 has the same conductivity type as that of the first semiconductor region R1. The first semiconductor region R1 and the third semiconductor region R3 are integrally provided with each other. The first semiconductor region R1 and the third semiconductor region R3 are linearly arranged in the X direction. One end of the third semiconductor region R3 in the X direction is connected to the second portion R12, and the other end of the third semiconductor region R3 in the X direction is separated from the side surface 2d side. The first semiconductor region R1 and the third semiconductor region R3 have a rectangular parallelepiped shape as a whole. A thickness (a length in the Z direction) of the third semiconductor region R3 is equal to the thickness (the length in the Z direction) of the first semiconductor region R1.

The side surface R1c of the first semiconductor region R1 constitutes a part of the side surface 2c. The upper surface R1a constitutes a part of the upper surface 2a. The lower surface R1b and the side surfaces R1d, R1e, and R1f are separated from the lower surface 2b and the side surfaces 2d, 2e, and 2f, respectively. The first portion R11 is not separated from the side surface R1c and constitutes a part of the side surface R1c. The second portion R12 is not separated from the side surface R1d and constitutes a part of the side surface R1d.

The second semiconductor region R2 is provided to be in contact with the lower surface R1b and the side surfaces R1e and R1f of the first semiconductor region R1. The second semiconductor region R2 has a U shape when seen in the Z direction and includes a first portion R21 which surrounds the first semiconductor region R1 and the third semiconductor region R3, and a second portion R22 disposed below the first semiconductor region R1 and the third semiconductor region R3. The second semiconductor region R2 covers the surface of the first semiconductor region R1 other than the upper surface R1a and the side surfaces R1c and R1d. The first portion R21 is provided to be in contact with the side surfaces R1e and R1f and covers the side surfaces R1e and R1f. The second portion R22 is provided to be in contact with the lower surface R1b and covers the lower surface R1b.

A thickness (a length in the Z direction) of the first portion R21 is equal to a thickness (a length in the Z direction) of the semiconductor layer 2. A thickness (a length in the Z direction) of the second portion R22 is thinner than the thickness (the length in the Z direction) of the semiconductor layer 2. The sum of the thickness of the second portion R22 and the thickness of the first semiconductor region R1 is equal to the thickness of the semiconductor layer 2. The second semiconductor region R2 constitutes a peripheral surface portions of the upper surface 2a other than the upper surface R1a and the upper surface of the third semiconductor region R3, a part of the side surface 2c, and the whole of the lower surface 2b and the side surfaces 2d, 2e and 2f.

The first ferromagnetic layer 3 is provided on the first portion R11. When seen in the Z direction, an end edge of the first ferromagnetic layer 3 on the side surface 2c side coincides with the side surface 2c. As described above, since the first ferromagnetic layer 3 is provided as close as possible to the side surface 2c, for example, detection of a minute external magnetic field becomes easy. The second ferromagnetic layer 4 is provided on the second portion R12. The reference electrode 7 is provided on the upper surface 2a of the semiconductor layer 2 to be separated from the first ferromagnetic layer 3 and the second ferromagnetic layer 4. The reference electrode 7 is in contact with the upper surface 2a of the semiconductor layer 2. The reference electrode 7 is provided on the third semiconductor region R3. The reference electrode 7 is opposed to the first ferromagnetic layer 3 in the X direction with the second ferromagnetic layer 4 interposed therebetween. The reference electrode 7 is formed of, for example, a nonmagnetic material such as aluminum. A Schottky barrier generated by a junction between the reference electrode 7 and the semiconductor layer 2 can be reduced by using a nonmagnetic material having a work function close to that of the semiconductor layer 2 as the material of the reference electrode 7. Thus, a resistance of an interface between the reference electrode 7 and the semiconductor layer 2 can be reduced.

The current source 20 is connected to the first ferromagnetic layer 3 and the second ferromagnetic layer 4 and is a means for causing a current to flow between the second ferromagnetic layer 4 and the first ferromagnetic layer 3. In FIG. 10, the voltage measurement unit 30 is connected to the second ferromagnetic layer 4 and the reference electrode 7 and measures a voltage between the second ferromagnetic layer 4 and the reference electrode 7. In the case A, the current source 20 supplies a constant current flowing in the first semiconductor region R1 from the second ferromagnetic layer 4 toward the first ferromagnetic layer 3. In the case B, the current source 20 supplies a constant current flowing in the first semiconductor region R1 from the first ferromagnetic layer 3 toward the second ferromagnetic layer 4.

In the magnetic sensor 10E, as in the magnetic sensor 10A (refer to FIG. 1), when a current is supplied by the current source 20, carriers having spins corresponding to a magnetization direction of the first ferromagnetic layer 3 are injected from the first ferromagnetic layer 3 serving as a magnetization free layer into the first portion R11. The injected spin-polarized carriers transport through the first portion R11, the third portion R13 and the second portion R12, and the spins corresponding to the magnetization direction of the first ferromagnetic layer 3 are mainly accumulated in the second portion R12 in the vicinity of the upper surface 2a.

A spin output voltage is obtained as a voltage change corresponding to a change in a relative angle between the direction of the spins accumulated in the second portion R12 and the magnetization direction of the second ferromagnetic layer 4 by measuring the voltage between the second ferromagnetic layer 4 and the reference electrode 7 with the voltage measurement unit 30. In this case, the spin output voltage which can be obtained is the same in principle as the spin output voltage obtained by the magnetic sensor 10A (refer to FIG. 1). As described above, in addition to the spin output voltage, a voltage including a voltage drop due to a resistance of the semiconductor layer 2, a resistance of the first ferromagnetic layer 3, a resistance of the second ferromagnetic layer 4, a resistance between the first ferromagnetic layer 3 and the semiconductor layer 2 and a resistance between the second ferromagnetic layer 4 and the semiconductor layer 2 is measured in the magnetic sensor 10A. On the other hand, a voltage not including the voltage drop due to the resistance of the semiconductor layer 2, the resistance of the first ferromagnetic layer 3, and the resistance between the first ferromagnetic layer 3 and the semiconductor layer 2 is measured in the magnetic sensor 10E. Therefore, in the magnetic sensor 10E, since a resistance of a voltage detection path is lower than that in the magnetic sensor 10A, a high magnetoresistance ratio can be obtained. As a result, it is possible to obtain a larger SN ratio.

Also in the magnetoresistance effect element 1E, as in the magnetoresistance effect element 1A (refer to FIGS. 1 and 2), a depletion layer is formed in the vicinity of the interface between the first semiconductor region R1 and the second semiconductor region R2. Thus, the influence of the interface trap on the carriers and the spins is suppressed, and a larger SN ratio than the conventional one can be obtained.

Sixth Embodiment

Figure 12:
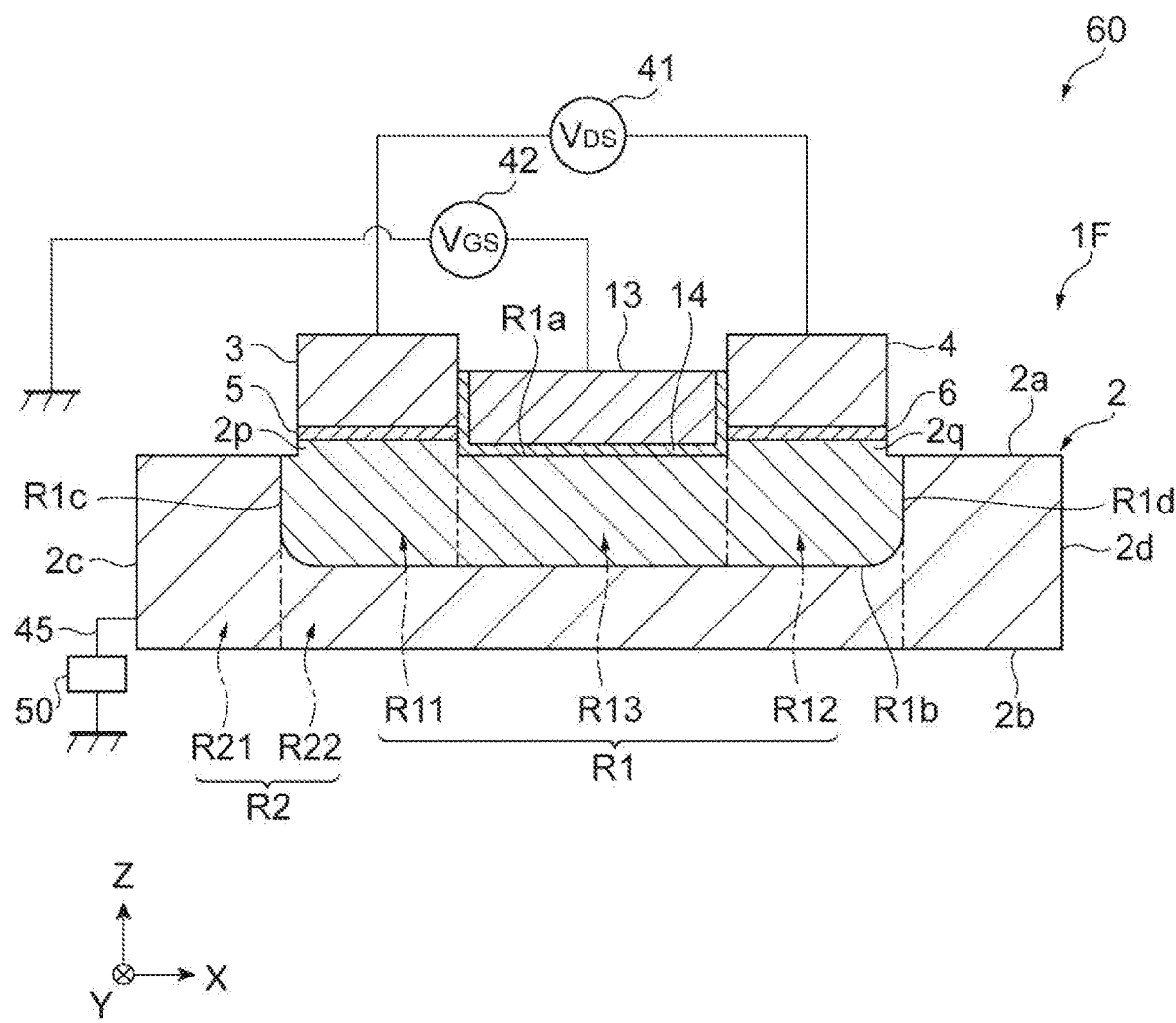
FIG. 12 is a cross-sectional view of a spin transistor according to a sixth embodiment.

A magnetoresistance effect element 1F and a spin transistor 60 according to a sixth embodiment will be described with reference to FIG. 12. FIG. 12 is a cross-sectional view of the spin transistor according to the sixth embodiment. An orthogonal coordinate system is shown in FIG. 12. As shown in FIG. 12, the spin transistor 60 includes the magnetoresistance effect element 1F, a gate electrode 13 and a third insulating layer 14 and is connected to a power supply 41 and a power supply 42.

The magnetoresistance effect element 1F is different from the magnetoresistance effect element 1A (refer to FIG. 1) according to the first embodiment in that a protrusion 2p is provided on the upper surface of the first portion R11 and a protrusion 2q is provided on the upper surface of the second portion R12, and is the same as the magnetoresistance effect element 1A in other points. The magnetoresistance effect element 1F will be described focusing on differences from the magnetoresistance effect element 1A. The protrusions 2p and 2q are respectively provided on substantially the entire upper surface of the first portion R11 and the second portion R12. A height of the protrusions 2p and 2q from the upper surface 2a is, for example, 10 nm or more and 1 μm or less. The protrusions 2p and 2q are formed, for example, by locally implanting a dopant (a n-type dopant in the case A, a p-type dopant in the case B) into a central portion of the upper surface of the semiconductor layer and then partially etching the upper surface portion of the semiconductor layer. The first insulating layer 5 is provided on the protrusion 2p. The second insulating layer 6 is provided on the protrusion 2q.

The gate electrode 13 is disposed on a region (that is, the upper surface of the third portion R13) of the upper surface R1a between the first ferromagnetic layer 3 and the second ferromagnetic layer 4. Metals, alloys, or conductive nitrides which have elements such as Pt, W, Ta, Ti, and Al may be used as electrode materials constituting the gate electrode 13. Polycrystalline silicon, silicide, germanide or the like may also be used. The gate electrode 13 is constituted to be capable of applying a voltage so that a carrier density in a region in the vicinity of the upper surface of the third portion R13 can be controlled.

The third insulating layer 14 is disposed between the third portion R13 and the gate electrode 13 to achieve insulation therebetween. The third insulating layer 14 is disposed between the first ferromagnetic layer 3 and the gate electrode 13 to achieve insulation therebetween. The third insulating layer 14 is disposed between the second ferromagnetic layer 4 and the gate electrode 13 to achieve insulation therebetween. The third insulating layer 14 is in contact with the third portion R13. A length of the gate electrode 13 and the third insulating layer 14 in the Y direction is the same as a length of the upper surface 2a in the Y direction. The third insulating layer 14 includes, for example, an oxide insulator such as a silicon oxide, a hafnium oxide, a zirconium oxide, an aluminum oxide, a lanthanum oxide, an yttrium oxide and a magnesium oxide, or a nitride insulator such as an aluminum nitride or a silicon nitride.

In the magnetoresistance effect element 1F, an impurity is selectively doped to the first semiconductor region R1. Therefore, there is a difference in carrier concentrations in the first semiconductor region R1. Specifically, the carrier concentrations in the first portion R11 and the second portion R12 are higher than the carrier concentration in the third portion R13. That is, the first portion R11 and the second portion R12 are heavily doped regions, and the third portion R13 is a lightly doped region. The spin transistor 60 constitutes an NNN type spin MOSFET in the case A and constitutes a PPP type spin MOSFET in the case B.

One of the first ferromagnetic layer 3 and the second ferromagnetic layer 4 serves as a source electrode, and the other one of the first ferromagnetic layer 3 and the second ferromagnetic layer 4 serves as a drain electrode. In the embodiment, the first ferromagnetic layer 3 serves as a source electrode, and the second ferromagnetic layer 4 serves as a drain electrode. The power supply 41 is connected to the first ferromagnetic layer 3 and the second ferromagnetic layer 4. The power supply 42 is connected to the ground and the gate electrode 13. The first ferromagnetic layer 3 is connected to the ground. In the spin transistor 60, the carrier density in the third portion R13 can be controlled by applying a voltage to the gate electrode 13 with the power supply 42.

In the case in which the spin transistor 60 constitutes the NNN type spin MOSFET, when a positive voltage is applied to the second ferromagnetic layer 4 by the power supply 41, even without applying a voltage to the gate electrode 13, the spin-polarized electrons are injected from the first ferromagnetic layer 3 into the semiconductor layer 2 and flow through the third portion R13 toward the second ferromagnetic layer 4. When a positive voltage is applied to the gate electrode 13 by the power supply 42, the carrier density in the vicinity of the upper surface of the third portion R13 increases, and thus the spin-polarized electrons easily flow. When a negative voltage is applied to the gate electrode 13 by the power supply 42, the carrier density in the vicinity of the upper surface of the third portion R13 decreases, and thus the spin-polarized electrons hardly flow.

In the case in which the spin transistor 60 constitutes the PPP type spin MOSFET, when a negative voltage is applied to the second ferromagnetic layer 4 by the power supply 41, even without applying a voltage to the gate electrode 13, the spin-polarized holes are injected from the first ferromagnetic layer 3 into the semiconductor layer 2 and flow through the third portion R13 toward the second ferromagnetic layer 4. When a negative voltage is applied to the gate electrode 13 by the power supply 42, the carrier density in the vicinity of the upper surface of the third portion R13 increases, and thus the spin-polarized holes easily flow. When a positive voltage is applied to the gate electrode 13 by the power supply 42, the carrier density in the vicinity of the upper surface of the third portion R13 decreases, and thus the spin-polarized electrons hardly flow.

As described above, the spin transistor 60 may constitute the NNN type or PPP type spin MOSFET and may realize a normally-on type (depletion type) spin transistor 60 in which a spin-polarized current flows without applying a voltage to the gate electrode 13.

Also in the magnetoresistance effect element 1F, as in the magnetoresistance effect element 1A (refer to FIG. 1), the depletion layer is formed in the vicinity of the interface between the first semiconductor region R1 and the second semiconductor region R2. Thus, the influence of the interface trap on the carriers and the spins is suppressed, and a larger SN ratio than the conventional one can be obtained. As a result, it is possible to obtain a SN ratio larger than the conventional one.

Since the spin transistor 60 includes the magnetoresistance effect element 1F, it is possible to obtain an SN ratio larger than the conventional one.

The present invention is not limited to the above-described embodiments.

In the magnetoresistance effect element 1A, the second semiconductor region R2 is provided to be in contact with all of the lower surface R1b and the side surfaces R1c, R1d, R1e, and R1f but may be provided to be in contact with at least a part of an end surface of the first semiconductor region R1. For example, the second semiconductor region R2 may not have the second portion R22 and may not be in contact with the lower surface R1b.

In the magnetoresistance effect element 1B, although the thickness of the second semiconductor region R2 is equal to the thickness of the semiconductor layer 2, the thickness of the second semiconductor region R2 may be thinner than the thickness of the semiconductor layer 2, and the second semiconductor region R2 may be separated from the insulating layer 12. Also, in the magnetoresistance effect element 1C, the thickness of the first portion R21 of the second semiconductor region R2 may be thinner than the thickness of the semiconductor layer 2, and the first portion R21 of the second semiconductor region R2 may be separated from the insulating layer 12. Also, in the magnetoresistance effect element 1D, the thicknesses of the first portion R21 and the second portion R22 of the second semiconductor region R2 are thinner than the thickness of the semiconductor layer 2, and the first portion R21 and the second portion R22 of the second semiconductor region R2 may be separated from the insulating layer 12.

In the magnetoresistance effect element 1E, the first semiconductor region R1 may be separated from the side surface 2c, and the first portion R21 of the second semiconductor region R2 may be provided to be in contact with the side surface 2c. In this case, the influence of the interface trap at the side surface R1c on the carriers and the spins may also be suppressed. In the magnetoresistance effect element 1E, the first portion R21 of the second semiconductor region R2 may be provided to be in contact with at least the side surfaces R1e and R1f of the first semiconductor region R1 and may not be provided on the side surface of the third semiconductor region R3 which serves as a voltage detection path. Thus, for example, the third semiconductor region R3 may constitute a part of each of the side surfaces 2e, 2f, and 2d.

In the magnetoresistance effect element 1C, the second semiconductor region R2 may have only the second portion R22 and may not have the first portion R21. Even in this case, the influence of the interface trap at least the upper surface R1a on the carriers and the spins can be suppressed.

The magnetoresistance effect elements 1A, 1E, and 1F may further include the support substrate 11 and the insulating layer 12, as in the magnetoresistance effect element 1B.

The magnetoresistance effect elements 1A, 1B, 1C, 1D, 1E, and 1F are provided with the wiring 45, but the wiring 45 may not necessarily be provided. Thus, the configuration of the magnetoresistance effect elements 1A, 1B, 1C, 1D, 1E, and 1F can be simplified. The wiring 45 is connected to the second semiconductor region R2 and the voltage source 50 but may be connected to the second semiconductor region R2 and the current source 20 or the power supply 41. Even in this case, a reverse bias voltage may be applied between the first semiconductor region R1 and the second semiconductor region R2 by the current source 20 or the power supply 41. Specifically, the magnetoresistance effect elements 1A, 1B, 1C, 1D, and 1E are changed so that one end of the current source 20 and the second semiconductor region R2 are electrically connected by the wiring 45. At this time, in the magnetoresistance effect elements 1A, 1B, 1C, and 1D, the wiring 45 is connected to the wiring at the current source 20 side from an intersection of the wiring connected to the current source 20 and the wiring connected to the voltage measurement unit 30. Accordingly, the current source 20 may also serve as a means for applying a reverse bias voltage to further increase a thickness of the depletion layer in the vicinity of the interface between the first semiconductor region R1 and the second semiconductor region R2. In the magnetoresistance effect elements 1F, the power supply 41 may also serve as a means for applying a reverse bias voltage to further increase the thickness of the depletion layer in the vicinity of the interface between the first semiconductor region R1 and the second semiconductor region R2 by electrically connecting one end of the power supply 41 to the second semiconductor region R2 using the wiring 45.

The magnetoresistance effect elements 1A, 1B, 1C, 1D, 1E, and 1F may not include the first insulating layer 5 and the second insulating layer 6.

In the magnetoresistance effect elements 1A, 1B, 1C, 1D, 1E, and 1F, instead of the first ferromagnetic layer 3 and the second ferromagnetic layer 4, for example, an electrode formed of a nonmagnetic material may be provided to be in contact with the upper surface 2a and thus to provide a semiconductor element having no magnetoresistance effect.

In the magnetic sensors 10A, 10B, 10C, 10D, and 10E, a change in a resistance due to the magnetoresistance effect may be measured by a change in a current value using a voltage source instead of the current source 20, and a current measurement unit instead of the voltage measurement unit 30. In this case, the voltage source and the current measurement unit are connected in series.

The magnetoresistance effect elements 1A, 1B, 1C, 1D, 1E, 1F may be formed by depositing a semiconductor film having a conductivity type different from that of the first semiconductor region R1 as the second semiconductor region R2 on the side surface, the upper surface and the lower surface of the semiconductor layer constituting the first semiconductor region R1.

The magnetoresistance effect elements 1A, 1B, 1C, and 1D may include the reference electrode 7 and the third semiconductor region R3, as in the magnetoresistance effect element 1E.

Figure 13:
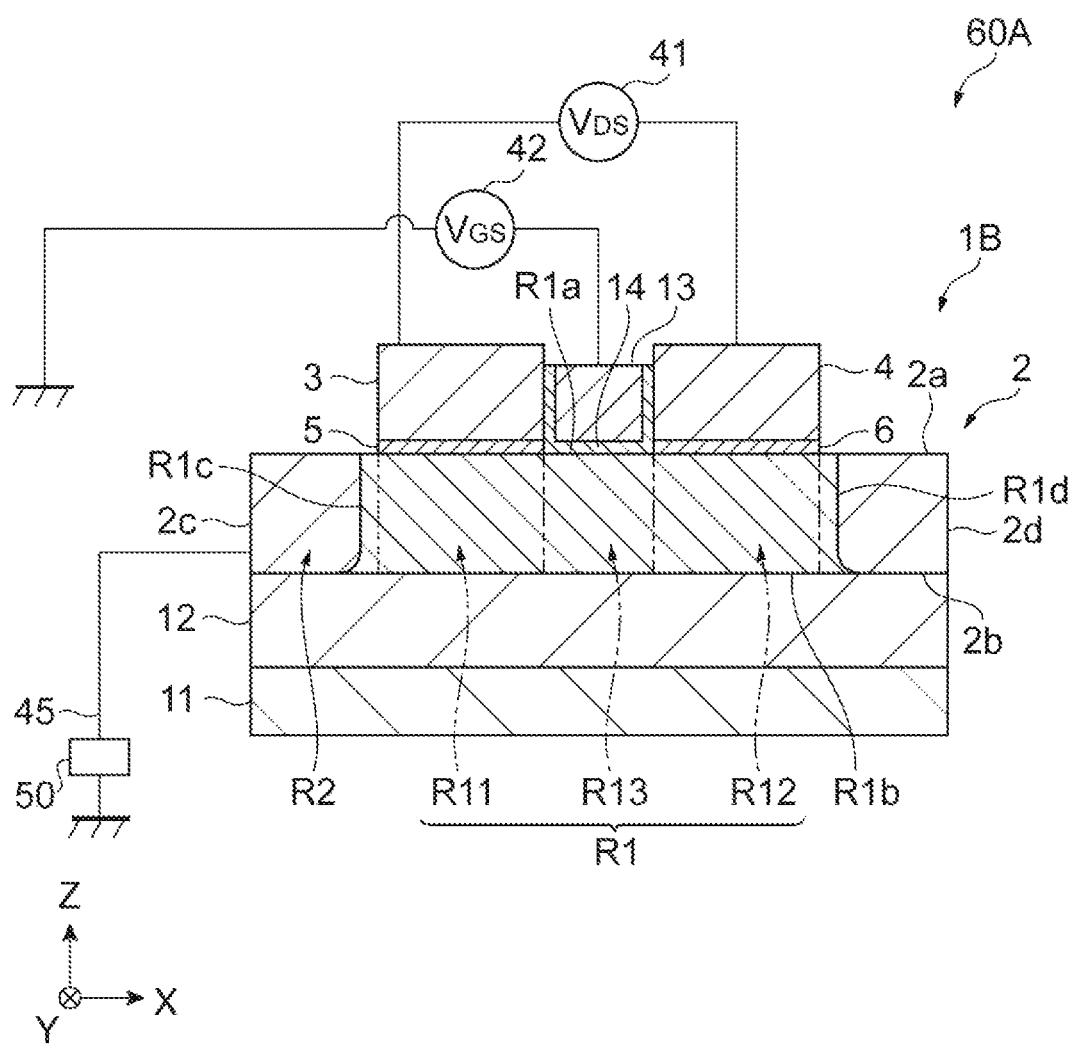
FIG. 13 is a cross-sectional view of a spin transistor according to a modified example.

The spin transistor 60 may include magnetoresistance effect elements 1A, 1B and 1D instead of the magnetoresistance effect element 1F. As an example, a modified example including the magnetoresistance effect element 1B instead of the magnetoresistance effect element 1F will be described. FIG. 13 is a cross-sectional view of a spin transistor according to the modified example. An orthogonal coordinate system is shown in FIG. 13. As shown in FIG. 13, a spin transistor 60A according to the modified example is different from the spin transistor 60 (refer to FIG. 12) in that the magnetoresistance effect element 1B is provided instead of the magnetoresistance effect element 1F, and is the same as the spin transistor 60 in other points. Since the spin transistor 60A includes the magnetoresistance effect element 1B, it is possible to obtain an SN ratio larger than the conventional one.

What is claimed is:

1. A magnetoresistance effect element comprising:
a semiconductor element comprising:
a semiconductor layer having:
a first semiconductor region having n-type conductivity; and
a second semiconductor region that has p-type conductivity and is in contact with at least a part of an end surface of the first semiconductor region; and
a first electrode and a second electrode which are separated from each other on the first semiconductor region, the first electrode and the second electrode being separated from the second semiconductor region and each including a ferromagnetic material.

2. The magnetoresistance effect element according to claim 1,
wherein a p-type dopant concentration in the first semiconductor region is lower than a p-type dopant concentration in the second semiconductor region.

3. The magnetoresistance effect element according to claim 1, further comprising:
wiring to apply a voltage in a direction such that the first semiconductor region becomes positive and the second semiconductor region becomes negative.

4. A magnetic sensor comprising:
the magnetoresistance effect element according to claim 1.

5. A spin transistor comprising:
the magnetoresistance effect element according to claim 1.

6. The magnetoresistance effect element according to claim 1,
wherein the first semiconductor region has an upper surface on which the first electrode and the second electrode are provided, a lower surface which is opposed to the upper surface, and a side surface which connects the upper surface with the lower surface and extends in a direction in which the first electrode and the second electrode are separated from each other, and
the second semiconductor region is in contact with at least a part of the side surface.

7. The magnetoresistance effect element according to claim 6,
wherein a length of the second semiconductor region in an opposing direction in which the upper surface and the lower surface are opposed to each other is equal to a length of the semiconductor layer in the opposing direction.

8. A magnetoresistance effect element comprising:
a semiconductor element comprising:
a semiconductor layer having:
a first semiconductor region having p-type conductivity; and
a second semiconductor region that has n-type conductivity and is in contact with at least a part of an end surface of the first semiconductor region; and
a first electrode and a second electrode which are separated from each other on the first semiconductor region, the first electrode and the second electrode being separated from the second semiconductor region and each including a ferromagnetic material.

9. The magnetoresistance effect element according to claim 8,
wherein an n-type dopant concentration in the first semiconductor region is lower than an n-type dopant concentration in the second semiconductor region.

10. The magnetoresistance effect element according to claim 8, further comprising:
wiring to apply a voltage in a direction such that the first semiconductor region becomes negative and the second semiconductor region becomes positive.

11. A magnetic sensor comprising:
the magnetoresistance effect element according to claim 8.

12. A spin transistor comprising:
the magnetoresistance effect element according to claim 8.

13. The magnetoresistance effect element according to claim 8,
wherein the first semiconductor region has an upper surface on which the first electrode and the second electrode are provided, a lower surface which is opposed to the upper surface, and a side surface which connects the upper surface with the lower surface and extends in a direction in which the first electrode and the second electrode are separated from each other, and
the second semiconductor region is in contact with at least a part of the side surface.

14. The magnetoresistance effect element according to claim 13,
wherein a length of the second semiconductor region in an opposing direction in which the upper surface and the lower surface are opposed to each other is equal to a length of the semiconductor layer in the opposing direction.

* * * * *